(12) United States Patent
Takizawa

(10) Patent No.: US 9,790,083 B2
(45) Date of Patent: Oct. 17, 2017

(54) VIBRATOR, MANUFACTURING METHOD OF VIBRATOR, ELECTRONIC DEVICE, ELECTRONIC APPARATUS, AND MOVING OBJECT

(71) Applicant: Seiko Epson Corporation, Tokyo (JP)

(72) Inventor: Teruo Takizawa, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/518,269

(22) Filed: Oct. 20, 2014

(65) Prior Publication Data

US 2015/0108591 A1    Apr. 23, 2015

(30) Foreign Application Priority Data

Oct. 21, 2013  (JP) .................................. 2013-218097

(51) Int. Cl.
- *H01L 29/84* (2006.01)
- *B81B 7/00* (2006.01)
- *H01L 23/053* (2006.01)

(52) U.S. Cl.
CPC .... *B81B 7/0041* (2013.01); *B81B 2201/0235* (2013.01); *B81B 2201/0242* (2013.01); *B81C 2203/0145* (2013.01); *H01L 23/053* (2013.01); *H01L 2224/05554* (2013.01); *H01L 2224/48091* (2013.01); *H01L 2224/73265* (2013.01); *H01L 2924/181* (2013.01)

(58) Field of Classification Search
CPC .......... B81B 7/0041; B81C 2203/0145; G01C 25/00; H01L 41/053
See application file for complete search history.

(56) References Cited

U.S. PATENT DOCUMENTS

| | | | |
|---|---|---|---|
| 2005/0095833 A1* | 5/2005 | Lutz | ..................... B81B 3/0005 |
| | | | 438/597 |
| 2011/0133605 A1 | 6/2011 | Ishikawa et al. | |
| 2012/0193732 A1 | 8/2012 | Chen et al. | |
| 2013/0074596 A1 | 3/2013 | Takizawa | |
| 2014/0015618 A1 | 1/2014 | Ishikawa et al. | |
| 2014/0202245 A1 | 7/2014 | Ishikawa et al. | |
| 2015/0345947 A1 | 12/2015 | Takizawa | |

FOREIGN PATENT DOCUMENTS

| | | |
|---|---|---|
| CN | 102616727 A | 8/2012 |
| CN | 103011051 A | 4/2013 |
| JP | 2005-064024 A | 3/2005 |
| JP | 2006-121467 A | 5/2006 |
| JP | 2010-103600 A | 5/2010 |
| JP | 2010-223763 A | 10/2010 |
| JP | 2011-124735 A | 6/2011 |
| JP | 2013-079868 A | 5/2013 |

* cited by examiner

*Primary Examiner* — Cory Eskridge
(74) *Attorney, Agent, or Firm* — Harness, Dickey & Pierce, P.L.C.

(57) ABSTRACT

A vibrator includes a base, a lid, and a functional element that is stored in a cavity formed by the base and the lid, in which the lid is provided with a sealing hole that penetrates through the lid and a sealing member that air-tightly seals the sealing hole, and in which the functional element includes a diffusion object shielding portion having a region of an accommodation opening which overlaps at least part of a region of a first opening of the sealing hole on a surface of the lid on the cavity side in a plan view of the functional element and the lid.

20 Claims, 17 Drawing Sheets

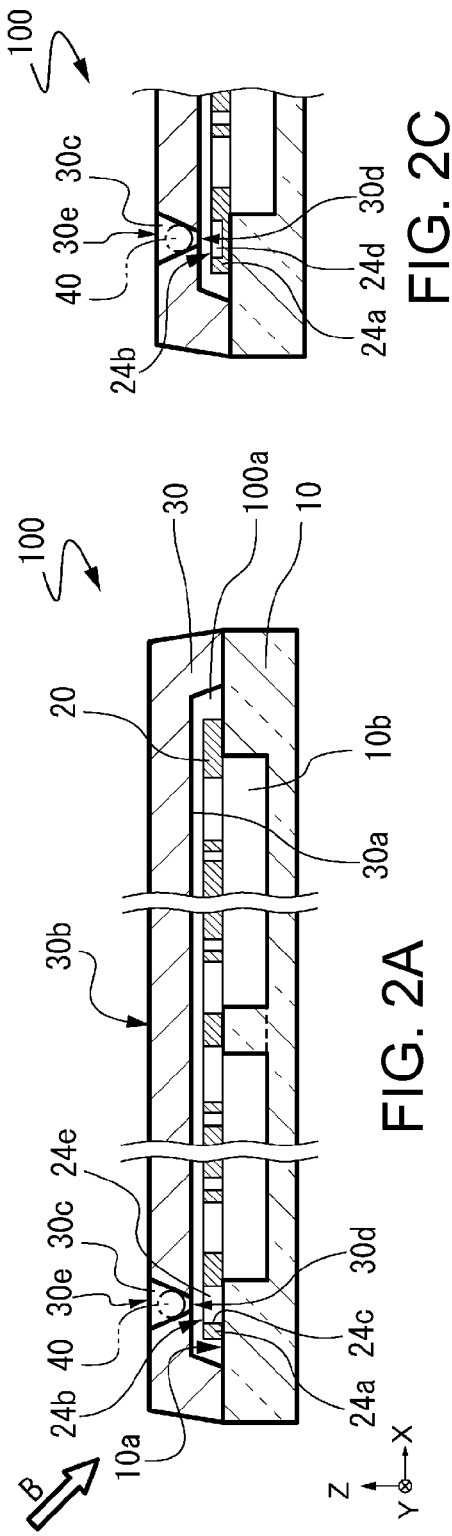
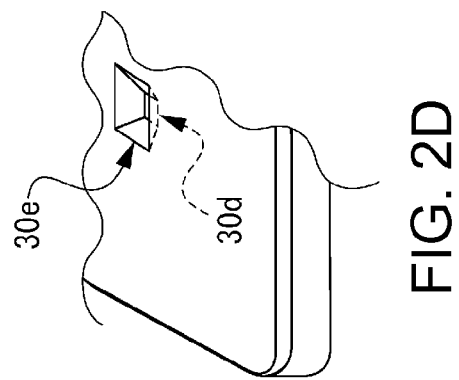
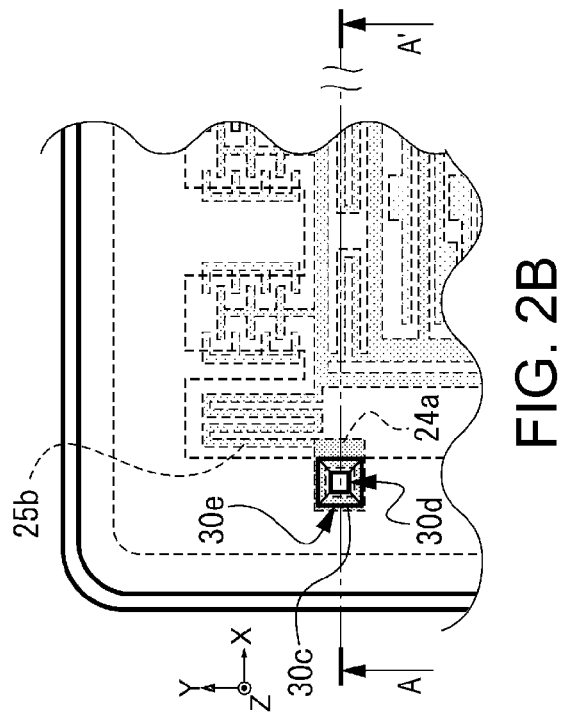
FIG. 2A
FIG. 2C
FIG. 2D
FIG. 2B

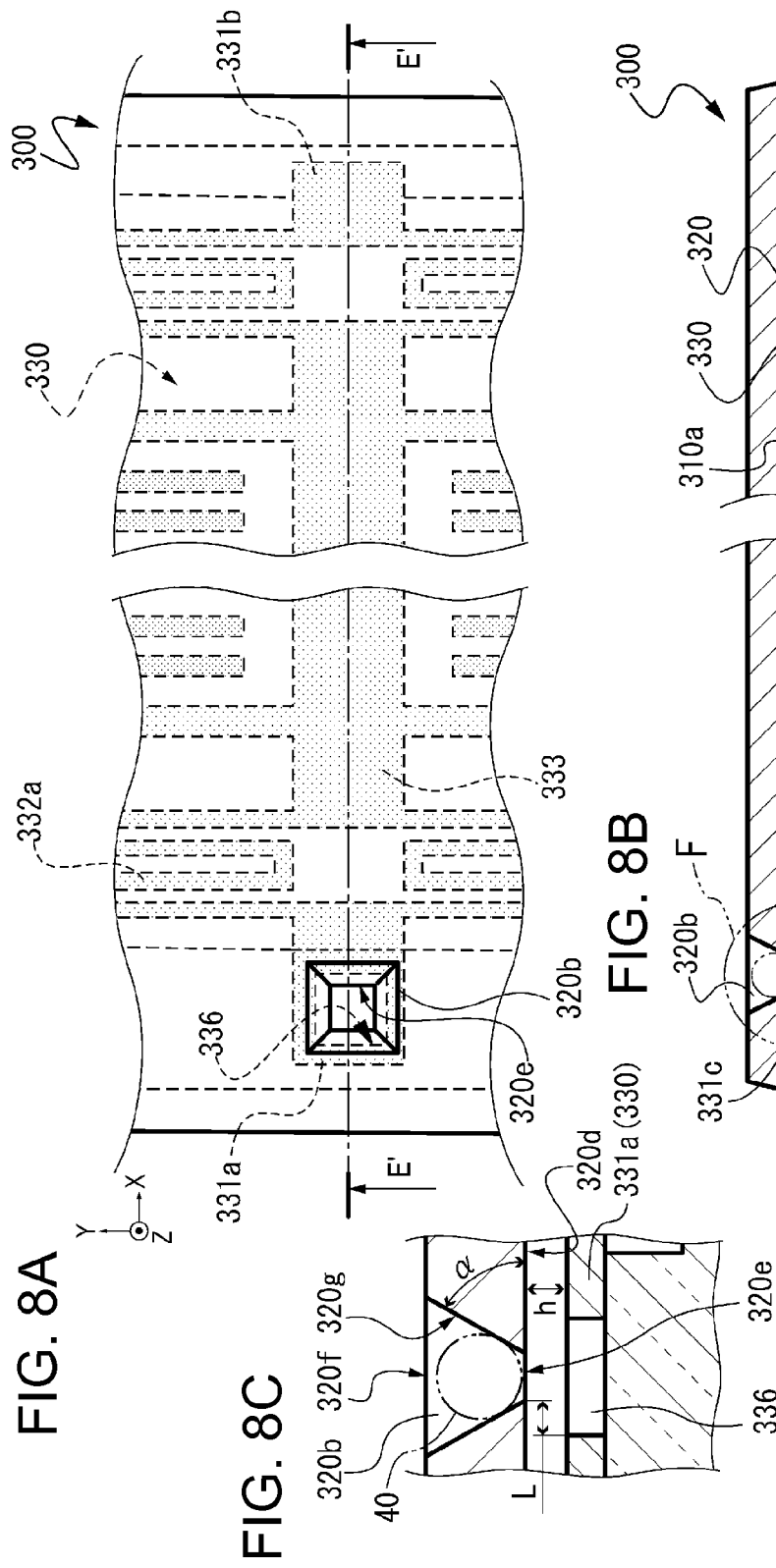
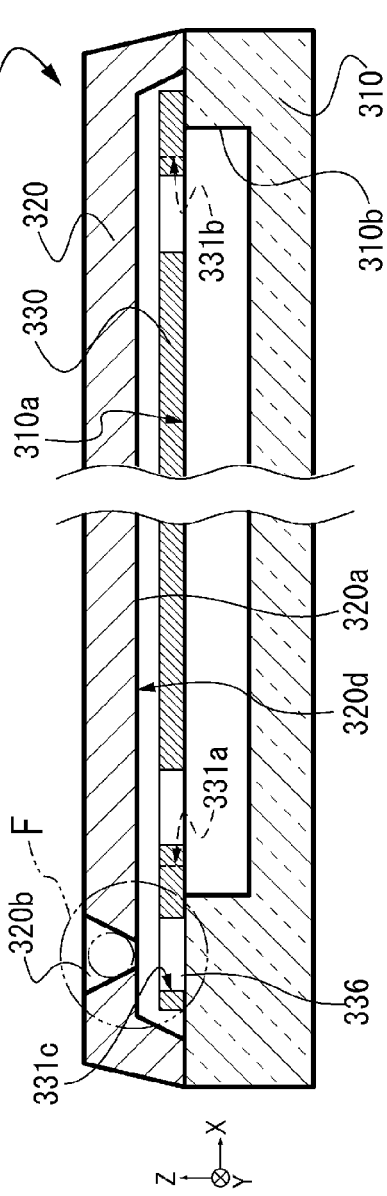
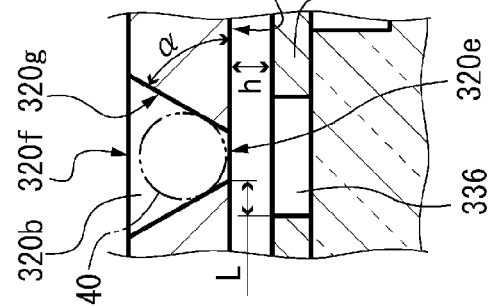

VIBRATOR, MANUFACTURING METHOD OF VIBRATOR, ELECTRONIC DEVICE, ELECTRONIC APPARATUS, AND MOVING OBJECT

CROSS-REFERENCE TO RELATED APPLICATION

This application claims priority to Japanese Patent Application No. 2013-218097 filed on Oct. 21, 2013. The entire disclosure of Japanese Patent Application No. 2013-218097 is hereby incorporated herein by reference.

BACKGROUND

1. Technical Field

The present invention relates to a vibrator, a manufacturing method of the vibrator, an electronic device, an electronic apparatus, and a moving object.

2. Related Art

In recent years, as a small-sized sensor device, an electronic device has been developed which includes functional elements detecting a physical quantity by using a micro electro mechanical systems (MEMS) technique in which a semiconductor manufacturing method is used as one of fine processing techniques. A physical quantity sensor element is known which includes, as functional elements, for example, a fixed electrode which is disposed in a fixed manner and a movable element which opposes the fixed electrode with a predetermined gap therebetween and is provided so as to be displaced, and detects a physical quantity such as acceleration or angular velocity on the basis of capacitance between the fixed electrode and the movable electrode.

In this physical quantity sensor element, in order to accurately detect displacement of the movable element, the physical quantity sensor element is stored in a package (storage container), and the package is air-tightly held, so as to prevent entry of foreign substances from the outside of the package. In addition, the package is air-tightly held in a decompressed state so that gaseous components hindering vibration of the movable electrode are removed, thereby allowing stable driving vibration to be obtained.

In the related art, as a technique for air-tightly sealing the package, JP-A-2005-64024 discloses that a through hole is formed at a base to which a vibrating component is fixed, and the through hole is closed by a sealing material so that a package is sealed so as to be maintained in a high vacuum state.

However, in the related art disclosed in JP-A-2005-64024, there is a concern that, when the sealing material is irradiated with electron beams such as laser light so as to be melted and to close the through hole, part of the melted sealing material may scatter or diffuse in the package as splash. A scattering object of the scattering or diffusing sealing material is attached to the vibrating component fixed to the base so as to increase a weight of a vibration portion of the vibrating component, and, as a result, it is difficult to obtain desired vibration characteristics.

In contrast, in the invention relating to a physical quantity detection device disclosed in JP-A-2010-223763, a configuration is disclosed in which a vibrator is disposed in a cavity constituted by a package and a lid welded to the package via a seal ring, and a ring-shaped member is disposed inside the seal ring, so that the ring-shaped member prevents a metal component which scatters due to welding of the seal ring from entering the cavity.

However, the physical quantity detection device disclosed in JP-A-2010-223763 also includes a through hole through which the cavity is deaerated and which is then closed by a sealing material, and thus the through hole disclosed in JP-A-2010-223763 and the through hole disclosed in JP-A-2005-64024 achieve the same operations and effects. In other words, also in the physical quantity detection device disclosed in JP-A-2010-223763, there is no suggestion of a configuration for minimizing a scattering object of the sealing member from the through hole.

SUMMARY

An advantage of some aspects of the invention is to provide a physical quantity detection vibrator in which a scattering or diffusing sealing material is not attached to a vibration element when a through hole for deaerating a cavity is sealed in order to stably operate the vibration element.

The invention can be implemented as the following forms or application examples.

Application Example 1

This application example is directed to a vibrator including a base; a lid; and a functional element that is stored in a cavity formed by the base and the lid, in which a sealing hole is formed at the lid, a sealing member is disposed in the sealing hole, the sealing hole includes a first opening on the cavity side, the functional element includes a diffusion object shielding portion provided with an accommodation opening, and the first opening overlaps the accommodate opening in at least part thereof in a plan view.

According to the vibrator of this application example, when the sealing member is melted by electron beams such as laser light and thus the sealing hole is air-tightly sealed, metal components of the sealing member which diffuse as splash from the first opening of the sealing hole into the cavity are accommodated in the diffusion object shielding portion. The diffusion object shielding portion is formed by partitions with the functional element in the cavity, and the splash-diffused metal components of the sealing member which are accommodated in the diffusion object shielding portion can be detained in the diffusion object shielding portion. Consequently, it is possible to minimize diffusion of the splash-diffused metal components of the sealing member up to the functional element, and thus to prevent the splash-diffused metal components of the sealing member from being attached to the functional element. Therefore, it is possible to provide a vibrator which includes the functional element having performance of high accuracy without degrading and deteriorating performance of the functional element.

Application Example 2

This application example is directed to the vibrator according to the application example described above, wherein the diffusion object shielding portion is a penetration recess which is formed by a penetration portion formed in the functional element and a base main surface of the base on which the functional element is placed.

According to this application example, since the functional element is provided with the diffusion object shielding portion, the diffusion object shielding portion is formed along with the functional element. Therefore, a manufacturing step for forming only the diffusion object shielding portion is not necessary, and thus it is possible to provide a vibrator which includes the functional element having performance of high accuracy without increasing cost.

Application Example 3

This application example is directed to the vibrator according to the application example described above, wherein the diffusion object shielding portion is an element recess which is formed on a main surface of the functional element opposing the lid.

According to this application example, since the functional element is provided with the diffusion object shielding portion, the diffusion object shielding portion is formed along with the functional element. Therefore, a manufacturing step for forming only the diffusion object shielding portion is not necessary, and thus it is possible to provide a vibrator which includes the functional element having performance of high accuracy without increasing cost.

Application Example 4

This application example is directed to a vibrator including a base; a lid; and a functional element that is stored in a cavity formed by the base and the lid, in which the lid is provided with a sealing hole, a sealing member is disposed in the sealing hole, the sealing hole includes a first opening on the cavity side, a diffusion object shielding portion provided with an accommodation opening is formed on a main surface of the base, the first opening overlaps the accommodate opening in at least part thereof in a plan view, and the diffusion object shielding portion and the functional element are formed by using the same material.

According to the vibrator of this application example, when the sealing member is melted by electron beams such as laser light and thus the sealing hole is air-tightly sealed, metal components which diffuse as splash from the first opening of the sealing hole into the cavity are accommodated in the diffusion object shielding portion. The diffusion object shielding portion is formed by partitions with the functional element in the cavity, and the splash-diffused metal components of the sealing member which are accommodated in the diffusion object shielding portion can be detained in the diffusion object shielding portion. Consequently, it is possible to minimize diffusion of the splash-diffused metal components of the sealing member up to the functional element, and thus to prevent the splash-diffused metal components of the sealing member from being attached to the functional element. Further, since a region for forming the diffusion object shielding portion is provided in a raw material substrate for forming the functional element, the diffusion object shielding portion is formed along with the functional element.

Therefore, it is possible to provide a vibrator which includes the functional element having performance of high accuracy without degrading and deteriorating performance of the functional element. A manufacturing step for forming only the diffusion object shielding portion is not necessary, and thus it is possible to provide a vibrator which includes the functional element having performance of high accuracy without increasing cost.

Application Example 5

This application example is directed to the vibrator according to the application example described above, wherein the diffusion object shielding portion includes a penetration recess which is formed by a penetration portion and a base main surface of the base on which the functional element is placed.

According to this application example, since a region for forming the diffusion object shielding portion is provided in a raw material substrate for forming the functional element, the diffusion object shielding portion is formed along with the functional element. Therefore, a manufacturing step for forming only the diffusion object shielding portion is not necessary, and thus it is possible to provide a vibrator which includes the functional element having performance of high accuracy without increasing cost.

Application Example 6

This application example is directed to the vibrator according to the application example described above, wherein the diffusion object shielding portion includes a recess in which the accommodation opening opposes the lid.

According to this application example, since a region for forming the diffusion object shielding portion is provided in a raw material substrate for forming the functional element, the diffusion object shielding portion is formed along with the functional element. Therefore, a manufacturing step for forming only the diffusion object shielding portion is not necessary, and thus it is possible to provide a vibrator which includes the functional element having performance of high accuracy without increasing cost.

Application Example 7

This application example is directed to the vibrator according to the application example described above, wherein when, in a plan view of the vibrator, a shortest distance between a circumference of the first opening of the sealing hole and a circumference of the accommodation opening of the diffusion object shielding portion is set to L, a gap distance between the surface of the lid on the cavity side and the diffusion object shielding portion is set to h, and an angle formed by a sealing hole surface which connects a second opening of the sealing hole on an opposite side to the cavity side to the first opening, and the surface of the lid on the cavity side is set to $\alpha$, a condition of $L > h/\tan \alpha$ is satisfied.

According to this application example, it is possible to form the diffusion object shielding portion which is larger than a diffusion region of metal component splash of the sealing member generated when the sealing hole is air-tightly sealed. Consequently, it is possible to minimize diffusion of the splash-diffused metal components of the sealing member up to the functional element, and thus to prevent the splash-diffused metal components of the sealing member from being attached to the functional element. Therefore, it is possible to provide a vibrator which includes the functional element having performance of high accuracy without degrading and deteriorating performance of the functional element.

Application Example 8

This application example is directed to a manufacturing method of a vibrator including a base, a lid, and a functional element that is stored in a cavity formed by the base and the lid, the method including preparing a substrate in which a silicon substrate for forming the functional element is joined onto a main surface which is one surface of the base, and the lid including a recess which forms a cavity on one main surface side of the lid and a sealing hole which penetrates through the recess and air-tightly seals the cavity; forming the functional element by using the silicon substrate joined to the substrate; joining the main surface of the base onto which the functional element is joined to the main surface of the lid so as to oppose each other; and disposing a sealing member in the sealing hole, and irradiating the sealing member with energy beams so that the sealing member is melted so as to close the sealing hole, in which, in the forming of the functional element, a diffusion object shielding portion which accommodates splash diffusion objects scattering from the sealing member in the irradiating of the sealing member is formed.

According to the manufacturing method of a vibrator of this application example, since a region for forming the diffusion object shielding portion is provided in a raw material substrate for forming the functional element, the diffusion object shielding portion is formed along with the functional element. Therefore, a manufacturing step for forming only the diffusion object shielding portion is not necessary, and thus it is possible to provide a vibrator which includes the functional element having performance of high accuracy without increasing cost.

Application Example 9

This application example is directed to the manufacturing method of a vibrator according to the application example described above, wherein in the preparing of the substrate, the sealing hole is formed in the lid by using at least a wet etching method, and an area of a first opening of the sealing hole formed on the cavity side is smaller than an area of a second opening formed on an opposite side to the cavity side.

According to this application example, the area of the second opening is made larger, and thus the sealing material can be stably placed in the sealing hole. The wet etching method has a higher etching rate, that is, a higher processing speed in etching than a dry etching method, and thus it is possible to further reduce a processing time when the sealing hole is formed.

Application Example 10

This application example is directed to an electronic device including the vibrator according to the application example described above.

According to this electronic device of the application example, the electronic device includes the functional element which can minimize diffusion of the splash-diffused metal components of the sealing member up to the functional element, so as to prevent the splash-diffused metal components of the sealing member from being attached to the functional element, and thus has performance of high accuracy without degrading and deteriorating performance of the functional element. Therefore, the electronic device can be stably operated.

Application Example 11

This application example is directed to an electronic apparatus including the vibrator according to the application example described above, or the electronic device according to the application example described above.

According to the electronic apparatus of this application example, the electronic apparatus includes the functional element which can minimize diffusion of the splash-diffused metal components of the sealing member up to the functional element, so as to prevent the splash-diffused metal components of the sealing member from being attached to the functional element, and thus has performance of high accuracy without degrading and deteriorating performance of the functional element. Therefore, the electronic apparatus can be stably operated.

Application Example 12

This application example is directed to a moving object including the vibrator according to the application example described above, the electronic device according to the application example described above, or the electronic apparatus according to the application example described above.

According to the moving object of this application example, the moving object includes the functional element which can minimize diffusion of the splash-diffused metal components of the sealing member up to the functional element, so as to prevent the splash-diffused metal components of the sealing member from being attached to the functional element, and thus has performance of high accuracy without degrading and deteriorating performance of the functional element. Therefore, the moving object can be stably operated.

BRIEF DESCRIPTION OF THE DRAWINGS

The invention will be described with reference to the accompanying drawings, wherein like numbers reference like elements.

FIG. 2A is a cross-sectional view taken along the line A-A' in FIG. 1; FIG. 2B is a partial exterior plan view; FIG. 2C is a partial cross-sectional view illustrating another form; and FIG. 2D is an exterior view which is viewed from an arrow B direction illustrated in FIG. 2A.

FIG. 8A is an enlarged plan view taken along the line E-E' in FIG. 7; FIG. 8B is a cross-sectional view taken along the line E-E' in FIGS. 7A and 8A; and FIG. 8C is an enlarged partial cross-sectional view of a part F illustrated in FIG. 8B.

DESCRIPTION OF EXEMPLARY EMBODIMENTS

Hereinafter, with reference to the drawings, embodiments of the invention will be described.

First Embodiment

Figure 1:
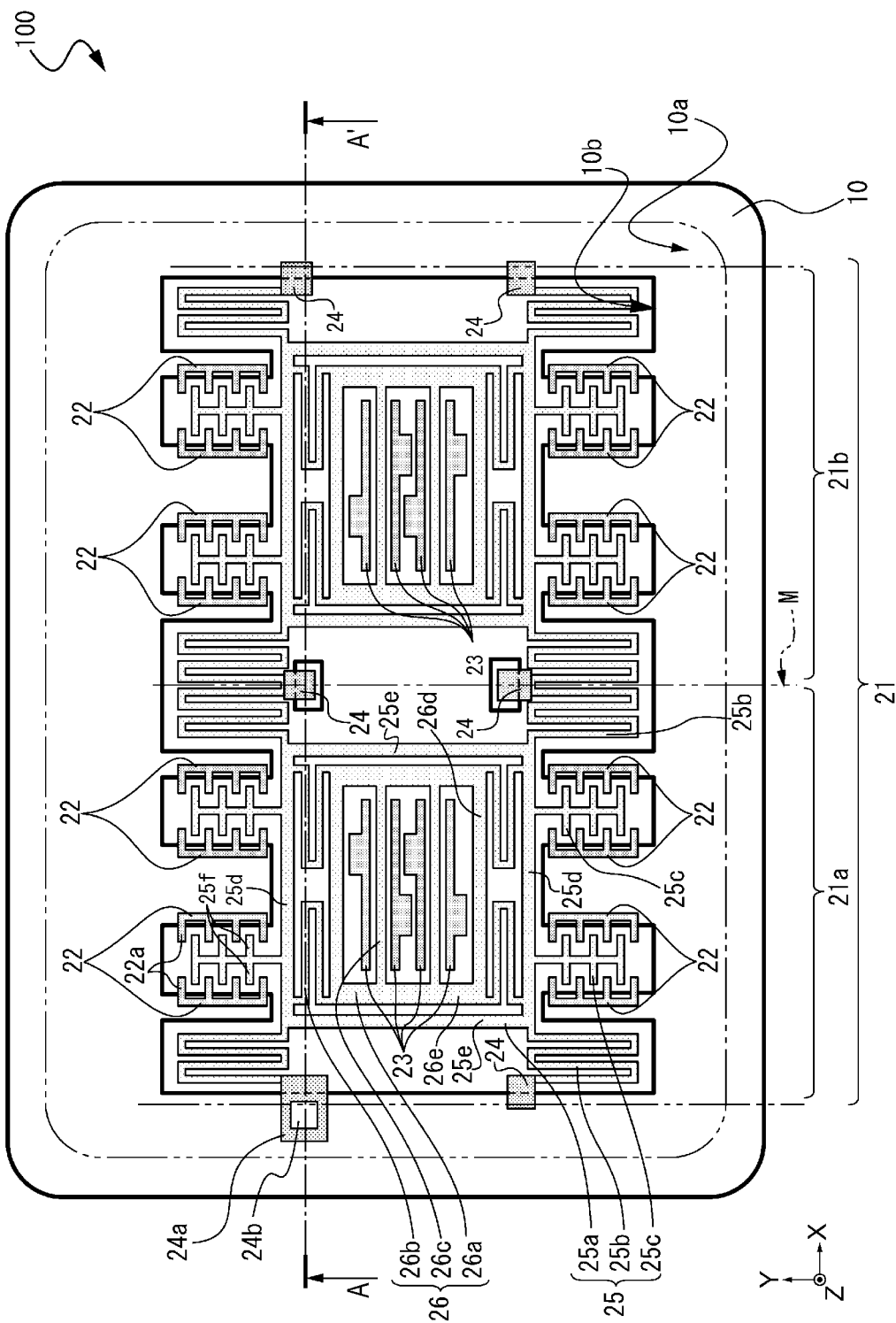
FIG. 1 is a plan view of a vibrator according to a first embodiment.

FIGS. 1 to 2D illustrate a vibrator according to a first embodiment. FIG. 1 is a plan view of a vibrator 100 according to the first embodiment in which a lid is not illustrated. FIG. 2A is a cross-sectional view of the vibrator 100 taken along the line A-A' in FIG. 1; FIG. 2B is a partial exterior plan view; FIG. 2C is a partial cross-sectional view illustrating another form of the form illustrated in FIG. 2A; and FIG. 2D is an exterior perspective view which is viewed from an arrow B direction illustrated in FIG. 2A.

As illustrated in FIG. 2A, the vibrator 100 includes a base 10, a functional element 20 which are disposed on a main surface 10a which is one surface of the base 10, and a lid 30 which is fixed to the main surface 10a of the base 10 and has a recess 30a forming a space which stores the functional element 20, that is, a so-called cavity 100a.

A gyro sensor element which detects angular velocity will be described as an example of the functional element 20. FIG. 1 is a plan view of the vibrator 100 whose lid 30 illustrated in FIG. 2A is omitted, and, as illustrated in FIG. 1, the functional element 20 (hereinafter, referred to as a gyro sensor element 20) which is provided in the vibrator 100 and detects angular velocity is disposed on and fixed to the main surface 10a of the base 10. The gyro sensor element 20 may include a driving system structure 21, a driving fixed electrode 22, a detection fixed electrode 23, and a fixing section 24. The gyro sensor element 20 may be obtained by processing a silicon substrate joined to the base 10 by using a MEMS technique. Consequently, it is possible to employ a fine processing technique used for manufacturing a silicon semiconductor device, and thus the gyro sensor element 20 can be obtained as a small-sized sensor element.

The gyro sensor element 20 is formed from the silicon substrate (not illustrated) joined to the main surface 10a of the base 10 by using the MEMS technique as described above, and is doped with impurities such as phosphorous or boron so as to be conductive. The driving system structure 21 is supported at the base 10 by the fixing section 24 which is disposed over a circumference of a recess 10b (refer to FIG. 2A) of the base 10 and is joined to the base 10 in a plan view (illustrated Z axis direction), and a fixing section 24a which has an opening 24b as an accommodation opening. Thus, the driving system structure 21 is disposed so as to move in the X axis direction and the Y axis direction in a region of the recess 10b in a plan view. The driving system structure 21 includes a first vibration body 21a and a second vibration body 21b, and the first vibration body 21a is connected to the second vibration body 21b along the X axis. The first vibration body 21a and the second vibration body 21b have symmetric shapes with respect to a boundary line M (a straight line along the Y axis) between the first vibration body 21a and the second vibration body 21b. Therefore, in the following, only a configuration of the first vibration body 21a will be described, and a description of a configuration of the second vibration body 21b will be omitted.

The first vibration body 21a includes a driving section 25 and a detection section 26. The driving section 25 includes a driving support portion 25a, a driving spring portion 25b, and a driving movable electrode 25c. The detection section 26 is disposed inside the frame-shaped driving support portion 25a. The driving support portion 25a is a portion in which a first extending part 25d which extends along the X axis is connected to a second extending part 25e which extends along the Y axis in a frame shape.

The driving spring portion 25b is disposed outside the driving support portion 25a. In the illustrated example, one end of the driving spring portion 25b is connected to the vicinity of a connection between the first extending part 25d and the second extending part 25e of the driving support portion 25a, and the other end thereof is connected to the fixing sections 24 and 24a. In the illustrated example, the driving spring portion 25b is provided at four locations in the first vibration body 21a, and the respective driving spring portions 25b are connected to three fixing sections 24 and a single fixing section 24a so as to be supported at the base 10. The fixing sections 24 disposed on a boundary line L between the first vibration body 21a and the second vibration body 21b may not be provided.

The driving spring portions 25b are formed so as to extend in the Y axis direction and to meander in the X axis direction, and are disposed so as to be symmetric to each other with respect to the X axis and the Y axis of the driving support portion 25a. If the driving spring portion 25b is formed and is disposed in the above-described manner, deflection (expansion and contraction) of the driving spring portion 25b is restricted when the driving support portion 25a moves in the Y axis direction or the Z axis direction, and thus deflection (expansion and contraction) of the driving spring portion 25b in the X axis direction is facilitated. In other words, although described later, the driving support portion 25a can be made to vibrate along the X axis. The driving spring portions 25b are not limited to the quantity and the arrangement thereof illustrated in FIG. 1 as long as the driving support portion 25a can be made to vibrate in the X axis direction.

The driving movable electrode 25c is connected to the first extending part 25d of the driving support portion 25a outside the driving support portion 25a. The driving fixed electrodes 22 are disposed outside the driving support portion 25a and are fixed onto the main surface 10a of the base 10. The driving fixed electrodes 22 are disposed so as to oppose each other with the driving movable electrode 25c interposed therebetween. In the illustrated present example, the driving fixed electrode 22 has comb-shaped protrusions 22a, and the driving movable electrode 25c has protrusions 25f which can be disposed between the comb-shaped protrusions 22a of the driving fixed electrode 22.

An AC voltage is applied between the driving fixed electrode 22 and the driving movable electrode 25c so as to generate an electrostatic force between both the electrodes, thereby causing the driving support portion 25a (the driving section 25) to vibrate along the X axis. Since the driving spring portion 25b is formed so as to expand and contract in the X axis direction, the vibration of the driving support portion 25a can be maintained, and the driving section 25 can also be held at the base 10. A gap between the protrusion 22a of the driving fixed electrode 22 and the protrusion 25f of the driving movable electrode 25c is made small, and thus an electrostatic force which acts on the driving fixed electrode 22 and the driving movable electrode 25c can be increased.

In the illustrated example, four driving movable electrode portions 25c are provided in the first vibration body 21a, but the number of driving movable electrode portions 25c is not particularly limited as long as the driving support portion 25a can be made to vibrate along the X axis. The driving fixed electrodes 22 are disposed so as to oppose each other with the driving movable electrode 25c interposed therebetween, but the driving fixed electrode 22 may be disposed only on either side of the driving movable electrode 25c as long as the driving support portion 25a can be made to vibrate along the X axis.

The detection section 26 is disposed inside the driving support portion 25a and is connected to the driving section 25. The detection section 26 includes a detection support portion 26a, a detection spring portion 26b, and a detection movable electrode 26c.

In the same manner as in the illustrated example, the detection support portion 26a has a configuration in which a third extending part 26d extending along the X axis and a fourth extending part 26e extending along the Y axis are connected to each other in a frame shape.

The detection spring portion 26b is disposed outside the detection support portion 26a and is connected to the detection support portion 26a and the driving support portion 25a. In the illustrated example, one end of the detection spring portion 26b is connected to the vicinity of a connection (corner) between the third extending part 26d and the fourth extending part 26e of the detection support portion 26a, and the other end thereof is connected to the first extending part 25d of the driving support portion 25a.

The detection spring portions 26b are formed so as to extend in the X axis direction and to meander in the Y axis direction, and are disposed so as to be symmetric to each other with respect to the X axis and the Y axis of the detection support portion 26a. If the detection spring portion 26b is formed and is disposed in the above-described manner, deflection (expansion and contraction) of the detection spring portion 26b is restricted when the detection support portion 26a moves in the X axis direction or the Z axis direction, and thus deflection (expansion and contraction) of the detection spring portion 26b in the Y axis direction is facilitated. In other words, the detection support portion 26a can easily be moved along the Y axis by an external force applied to the detection support portion 26a along the Y axis, that is, a so-called Coriolis force which is generated by angular velocity applied to the gyro sensor element 20 in a state in which the driving section 25 vibrates. The number of detection spring portions 26b is not limited to the number illustrated in FIG. 1 as long as the detection support portion 26a can be moved along the Y axis.

The detection movable electrode 26c is disposed inside the detection support portion 26a, extends along the X axis, and is connected to the fourth extending part 26e. The detection fixed electrode 23 fixed to the base 10 is disposed so as to be separated from and be interposed between the detection movable electrodes 26c in an inner region of the detection support portion 26a. In other words, the detection movable electrodes 26c are disposed so as to oppose each other with the detection fixed electrode 23 interposed therebetween.

A movement of the detection section 26 in the Y axis direction is detected by using a variation in capacitance between the detection fixed electrode 23 and the detection movable electrode 26c, caused by the movement of the detection section 26 in the Y axis direction. The quantity, shapes, and arrangements of the detection movable electrodes 26c and the detection fixed electrodes 23 are not particularly limited as long as a variation in capacitance between the detection movable electrode 26c and the detection fixed electrode 23 can be detected.

In order to stably drive the above-described gyro sensor element 20, the inside of the cavity 100a is preferably in a decompressed environment or a vacuum environment in the vibrator 100 illustrated in FIG. 2A. Therefore, as illustrated in FIG. 2A, a sealing hole 30c which penetrates from the recess 30a forming the cavity 100a to an outer surface 30b is formed in the lid 30. An internal gas of the cavity 100a is exhausted through the sealing hole 30c so that the inside of the cavity 100a is turned to a decompressed state or a vacuum state, and a sealing member 40 which is a solder for sealing is melted so as to close the sealing hole 30c, and thus the cavity 100a is air-tightly sealed.

The sealing hole 30c has a first opening 30d on the cavity 100a side and a second opening 30e on the outer surface 30b side of the lid 30, and, in a plan view, that is, when viewed from the Z axis direction, as illustrated in FIG. 2B, at least the first opening 30d of the sealing hole 30c is disposed so as to overlap the opening 24b of the fixing section 24a. As illustrated in FIG. 2D, in the present embodiment, the sealing hole 30c is formed in a so-called pyramid shape having the rectangular first opening 30d and second opening 30e, but is not limited thereto, and may have a conical shape. An area of the first opening 30d is preferably smaller than an area of the second opening 30e. Consequently, the sealing member 40 can be stably placed in the sealing hole 30c.

As illustrated in FIG. 1, the fixing section 24a has the opening 24b on the surface opposite the lid 30, and the opening 24b is formed by a penetration portion 24c formed in the fixing section 24a as illustrated in FIG. 2A. The opening 24b is not limited to being formed by the penetration portion 24c described in the present example, and may be formed in the fixing section 24a of the gyro sensor element 20 as a recess 24d having the opening 24b as illustrated in FIG. 2C.

The penetration portion 24c is formed as a recess 24e which is a penetration recess which has the opening 24b on the lid 30 side together with the main surface 10a of the base 10. The recess 24e is a diffusion object shielding portion which accommodates metal component splash of the sealing member 40 in the cavity 100a when the sealing member 40 described later is melted by electron beams so as to close the sealing hole 30c. Hereinafter, the recess 24e, and the recess 24d illustrated in FIG. 2C are respectively referred to as a diffusion object shielding portion 24e and a diffusion object shielding portion 24d. However, in the following description, only the diffusion object shielding portion 24e will be described.

Figure 3A:
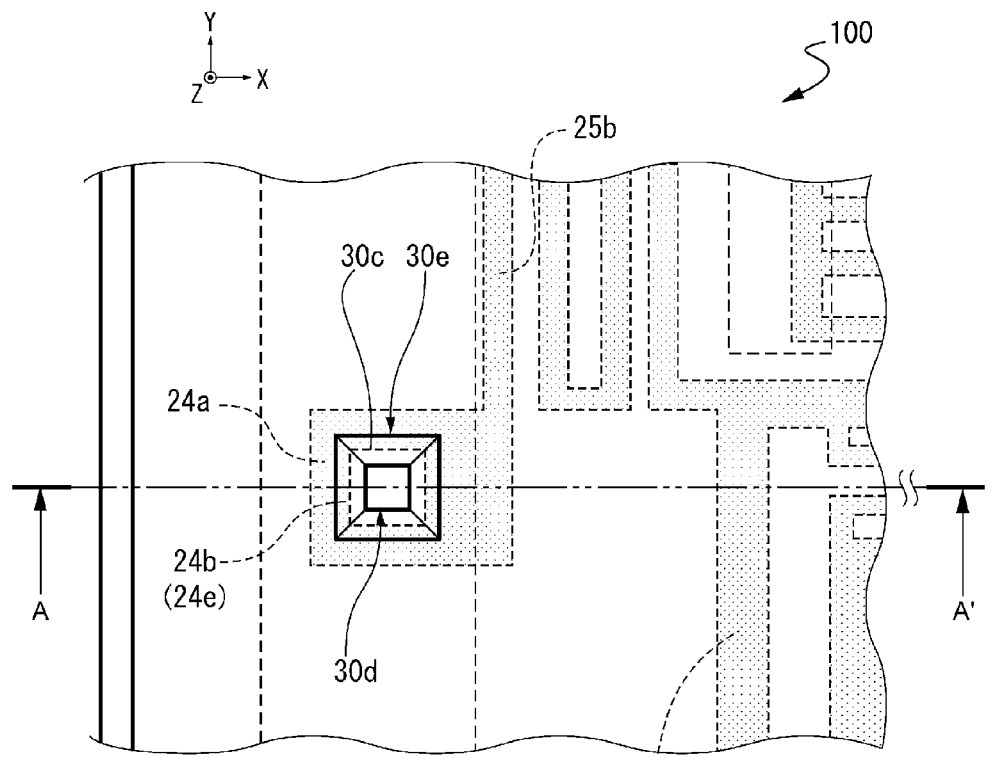
FIG. 3A is a schematic plan view of the vicinity of a sealing hole of the vibrator according to the first embodiment.
Figure 3B:
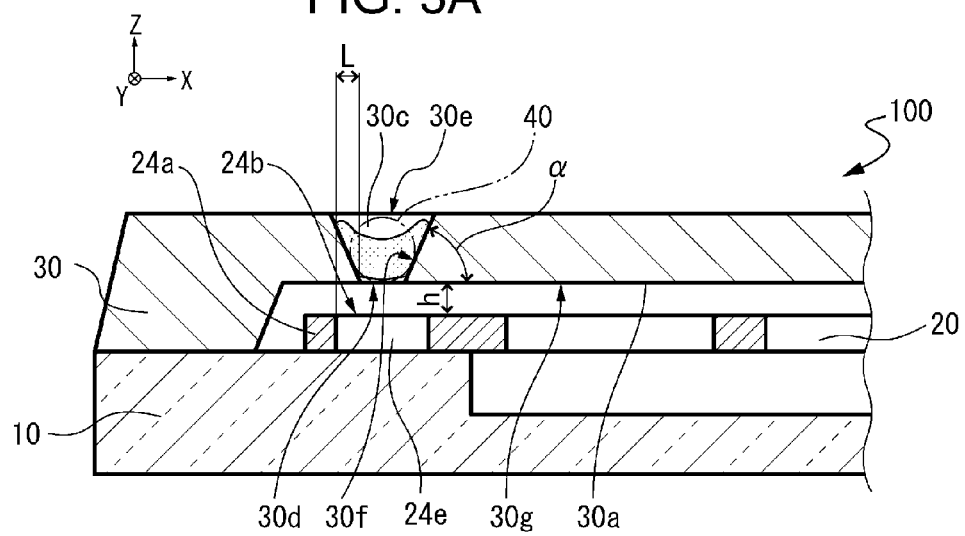
FIG. 3B is a partial cross-sectional view taken along the line A-A' in FIGS. 1A and 3A.

With reference to FIGS. 3A and 3B, a description will be made of a relationship between the sealing hole 30c provided in the lid 30 and the diffusion object shielding portion 24e. FIG. 3A is an exterior plan view in the vicinity of the sealing hole 30c of the vibrator 100, and FIG. 3B is a partial cross-sectional view in the vicinity of the sealing hole 30c, taken along the line A-A' which passes through the sealing hole 30c.

As illustrated in FIG. 3A, in a plan view, that is, when viewed from the Z axis direction, the sealing hole 30c is disposed so as to overlap the fixing section 24a having the opening 24b of the gyro sensor element 20. The first opening 30d of the sealing hole 30c is disposed in the region of the opening 24b of the fixing section 24a in a plan view. In other words, the first opening 30d is disposed in the region of the diffusion object shielding portion 24e in a plan view.

In the above-described arrangement of the sealing hole 30c and the fixing section 24a in a plan view, as illustrated in FIG. 3B, a sealing hole surface 30f which connects the first opening 30d and the second opening 30e of the sealing hole 30c to each other is a tilt surface having a surface angle α formed by the sealing hole surface 30f and a bottom 30g of the recess 30a of the lid 30 in order to reliably close at least the first opening 30d while stably placing the sealing member 40. As one of the methods of forming the sealing hole surface 30f having the surface angle c, the lid 30 is formed from a silicon substrate, and, as a method of forming the sealing hole 30c in the lid 30, wet etching is used. In wet etching of silicon, the sealing hole surface 30f is formed as a tilt surface having the surface angle α due to etching anisotropy of silicon. Forming the surface angle α is not limited to using etching anisotropy, and the surface angle α may be formed through mechanical processing using a press or the like, for example, if the lid is made of a metal.

If a distance between an edge of the first opening 30d of the sealing hole 30c and an edge of the opening 24b of the fixing section 24a when viewed from the Z axis direction is set to L, and a gap between the gyro sensor element 20 and the bottom 30g of the recess 30a of the lid 30 is set to h, the following expression is preferably satisfied.

$$L > h/\tan \alpha \quad (1)$$

When the sealing member 40 is melted by electron beams or the like, and thus the sealing hole 30c is air-tightly sealed, there is a concern that part of the melted sealing member 40 may scatter from the first opening 30d as splash and diffuse in the cavity 100a, and the splash may be attached to the driving system structure 21 (refer to FIG. 1) which is a driving portion of the gyro sensor element 20. If the sealing hole 30c and the opening 24b of the fixing section 24a are formed according to the condition represented in Expression (1), the splash of the sealing member 40 can be accommodated in the diffusion object shielding portion 24e, and thus it is possible to minimize unnecessary splash diffusion of the sealing member 40 in the cavity 100a.

Figure 4:
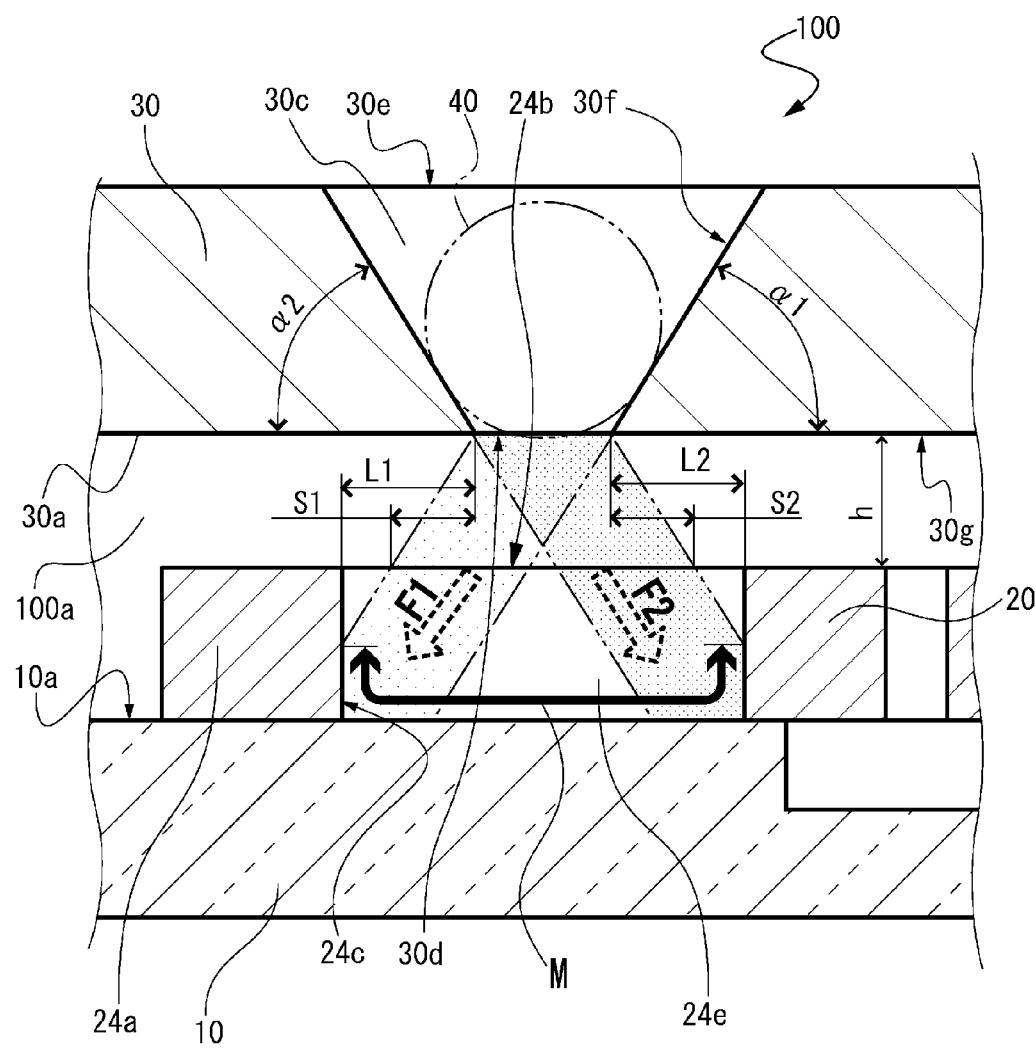
FIG. 4 is a diagram illustrating a relationship between the sealing hole of the vibrator and a diffusion object shielding portion according to the first embodiment.

With reference to FIG. 4, a description will be made of a form in which splash diffusion of the sealing member 40 is minimized. As illustrated in FIG. 4, if the sealing member 40 is irradiated with electron beams or the like and is thus melted, some metal components contained in the sealing member 40 melted by irradiation energy of the electron beams become fine splash and scatter. The scattering of the splash is performed in a direction along the sealing hole surface 30f which connects the first opening 30d and the second opening 30e of the sealing hole 30c to each other, that is, in an arrow direction of a scattering region F1 with a width of the first opening 30d along an angle α1 formed by the sealing hole surface 30f and the bottom 30g of the recess 30a of the lid 30.

Similarly, also in another surface of the sealing hole 30c, splash of metal components of the sealing member 40 scatters in a direction along the sealing hole surface 30f which connects the first opening 30d and the second opening 30e of the sealing hole 30c to each other, that is, in an arrow direction of a scattering region F2 with a width of the first opening 30d along an angle α2 formed by the sealing hole surface 30f and the bottom 30g of the recess 30a of the lid 30.

In this case, the right side h/tan α (2) of Expression (1) is represented in FIG. 4 as follows.

$$h/\tan \alpha 1 = S1 \quad (3)$$

$$h/\tan \alpha 2 = S2 \quad (4)$$

With respect to S1 and S2 in Equations (3) and (4), the opening 24b of the diffusion object shielding portion 24e is formed so that distances L1 and L2 between the edges of the first opening 30d and the edges of the opening 24b of the diffusion object shielding portion 24e satisfy the following conditions.

$$L1 > S1 \quad (5)$$

$$L2 > S2 \quad (6)$$

Therefore, the scattering regions F1 and F2 are prevented from diffusing to the outside of the diffusion object shielding portion 24e by the inner circumferential wall of the penetration portion 24c forming the diffusion object shielding portion 24e, and splash of metal components of the sealing member 40 is attached to the inner wall of the penetration portion 24c in a region M inside the diffusion object shielding portion 24e and the main surface 10a of the base 10.

As described above, the opening 24b of the diffusion object shielding portion 24e formed in the fixing section 24a is formed so as to satisfy Expression (1) (refer to FIGS. 3A and 3B) with respect to the first opening 30d of the sealing hole 30c on the cavity 100a side over the entire circumference of the edge of the first opening 30d. Therefore, splash-diffused metal components into the cavity 100a, generated when the sealing member 40 is melted, can be accommodated in the diffusion object shielding portion 24e. Thus, it is possible to prevent a metal scattering object from the sealing member 40 from being attached to the gyro sensor element 20, especially, the driving system structure 21, and thus to provide the vibrator 100 which includes the gyro sensor element 20 having performance of high accuracy.

Second Embodiment

Figure 5:
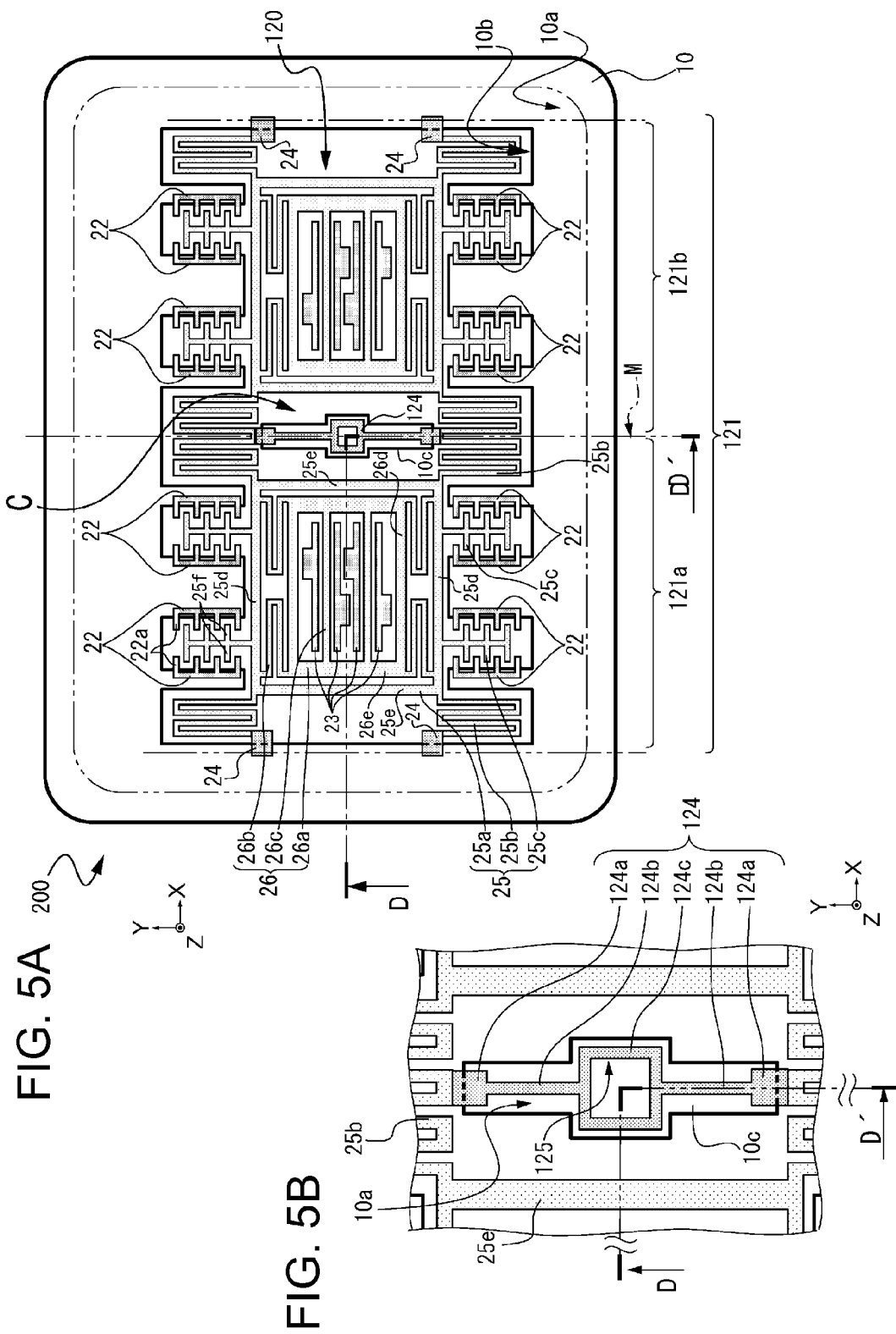
FIG. 5A is a plan view of a vibrator according to a second embodiment.
FIG. 5B is an enlarged plan view of a part C illustrated in FIG. 5A.

FIGS. 5A and 5B are plan views illustrating a vibrator 200 according to a second embodiment. The vibrator 200 according to the second embodiment is different from the vibrator 100 according to the first embodiment in terms of a form of the diffusion object shielding portion 24e provided in the gyro sensor element 20, and other constituent elements thereof are the same as those of the vibrator 100. Thus, in the vibrator 200, the same constituent elements as those of the vibrator 100 are given the same reference numerals, and description thereof will be omitted.

FIG. 5A is a plan view of the vibrator 200 in which the lid 30 is not illustrated, and FIG. 5B is a partially enlarged diagram of a part C illustrated in FIG. 5A. As illustrated in FIG. 5A, in the vibrator 200, a gyro sensor element 120 is provided on the main surface 10a of the base 10. The gyro sensor element 120 may include a driving system structure 121, a driving fixed electrode 22, a detection fixed electrode 23, and a fixing section 24. The driving system structure 121 includes a first vibration body 121a and a second vibration body 121*b*, and the first vibration body 121*a* is connected to the second vibration body 121*b* along the X axis.

A boundary fixing section 124, which is connected to the driving spring portion 25*b* which is disposed along a boundary line M connecting the first vibration body 121*a* to the second vibration body 121*b*, is formed on the main surface 10*a* of a partition 10*c* formed at the base 10 along the boundary line M. As illustrated in FIG. 5B, the boundary fixing section 124 includes a fixing portion 124*a* which is connected to the driving spring portion 25*b*, an elongation portion 124*b* which is elongated from the fixing portion 124*a*, and a frame 124*c* connected to the elongation portion 124*b*, and is formed on the main surface 10*a* of the partition 10*c*.

Figure 6:
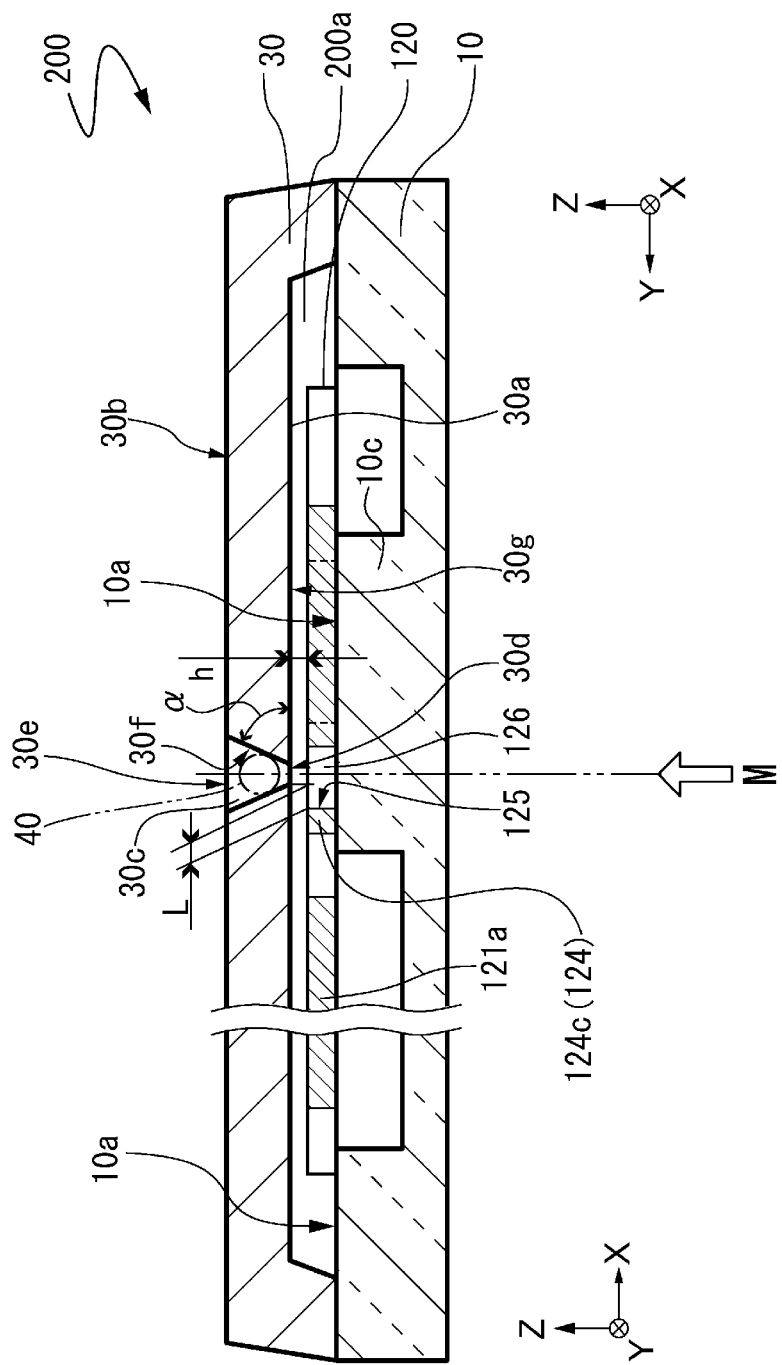
FIG. 6 is a cross-sectional view taken along the line D-D' in FIG. 5A.

FIG. 6 is a cross-sectional view taken along the line D-D' in FIG. 5A or 5B. As illustrated in FIG. 6, in the frame 124*c*, the inside of the frame 124*c* is formed as a through hole 125 which penetrates through the gyro sensor element 120, and a recess 126 is formed by the through hole 125 and the main surface 10*a* of the base 10. In a plan view of the vibrator 200, that is, when viewed from the Z axis direction, the sealing hole 30*c* is formed in the lid 30 so that the first opening 30*d* of the sealing hole 30*c* overlaps the recess 126.

The above-described recess 126 accommodates diffusion objects containing metal components of the sealing member 40 which scatters in a cavity 200*a* when the sealing member 40 closing the sealing hole 30*c* is melted by electron beams. Hereinafter, the recess 126 is referred to as a diffusion object shielding portion 126.

Also in the vibrator 200 according to the second embodiment, in the same manner as in the vibrator 100 according to the first embodiment, the relationship, illustrated in FIGS. 3A and 3B, between the sealing hole 30*c*, the first opening 30*d*, and an opening of the diffusion object shielding portion 126 is applied. In other words, a surface angle formed by the sealing hole surface 30*f* which connects the first opening 30*d* and the second opening 30*e* of the sealing hole 30*c*, and the bottom 30*g* of the recess 30*a* of the lid 30, is set to α, and a distance between the edge of the first opening 30*d* of the sealing hole 30*c* and the edge of the opening 24*b* of the fixing section 24*a* when viewed from the Z axis direction is set to L. If a gap between the gyro sensor element 20 and the bottom 30*g* of the recess 30*a* of the lid 30 is set to h, the following expression is preferably satisfied.

$$L > h/\tan \alpha \quad (1)$$

As described above, the sealing hole 30*c* of the lid 30 is disposed so as to overlap, in a plan view, the frame 124*c* provided at the boundary fixing section 124 which is disposed between the first vibration body 121*a* and the second vibration body 121*b*. Therefore, the recess, as the diffusion object shielding portion 126, formed by the frame 124*c* can accommodate metal components which scatter when the sealing member 40 is melted. Thus, it is possible to prevent a metal scattering object from the sealing member 40 from being attached to the gyro sensor element 120, especially, the driving system structure 121, and thus to provide the vibrator 200 which includes the gyro sensor element 120 having performance of high accuracy. In the same manner as in the gyro sensor element 20 provided in the vibrator 100 according to the first embodiment, the diffusion object shielding portion 126 is not limited to being formed by the through hole 125 and the main surface 10*a* of the base 10, and the through hole 125 may be formed as a recess of the gyro sensor element 120.

Figure 7:
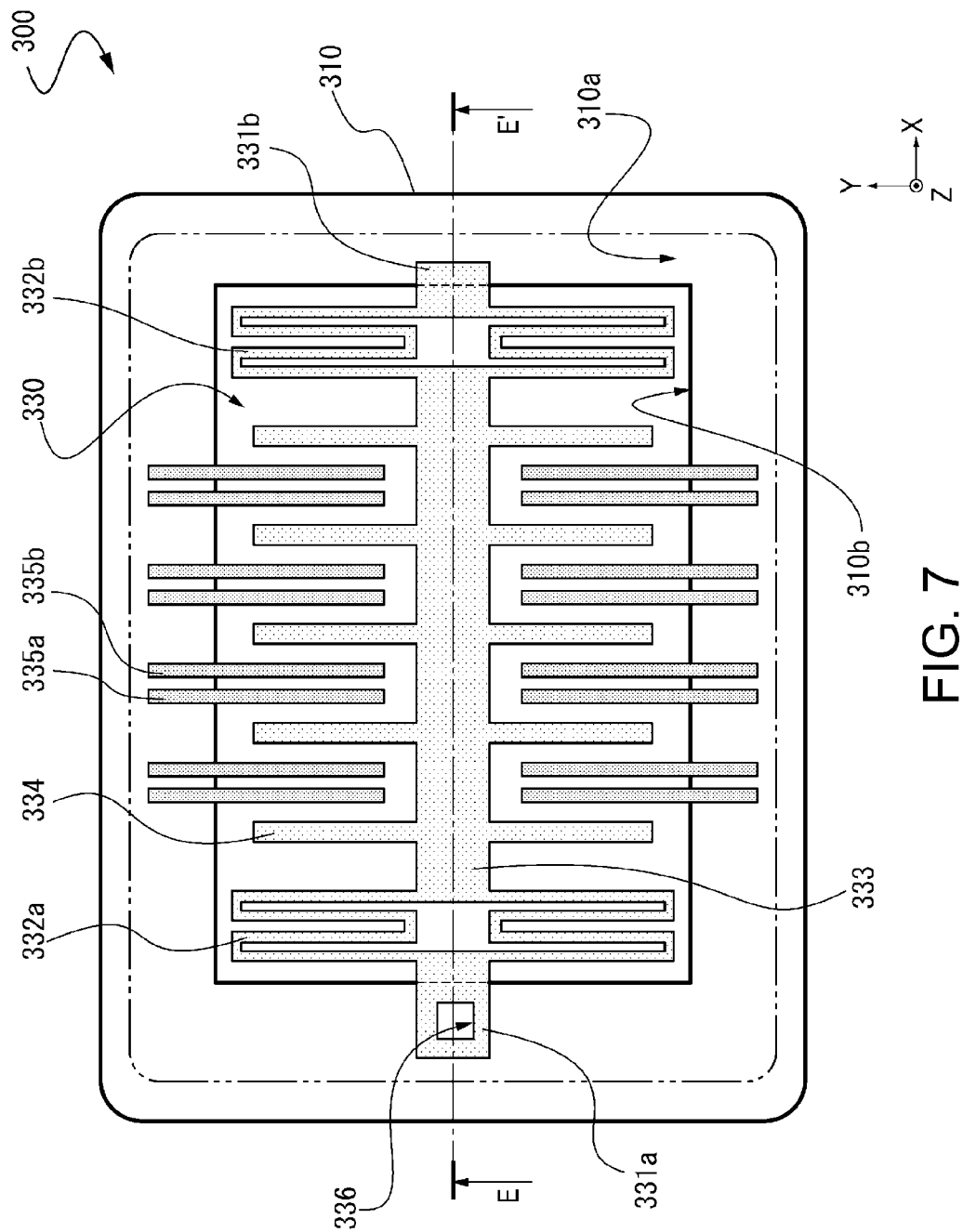
FIG. 7 is a plan view illustrating a vibrator in another form according to the second embodiment.

Although a description has been made of the form of the vibrator 100 or the vibrator 200 in which the gyro sensor element 20 or the gyro sensor element 120 as a functional element is provided with the diffusion object shielding portion 24*e* or 126, even a vibrator including an acceleration sensor element as a functional element may be provided with a diffusion object shielding portion. FIG. 7 illustrates a vibrator which includes an acceleration sensor as a functional element and is a plan view in which a lid is not illustrated. FIG. 8A is a partial exterior plan view of the vibrator; FIG. 8B is a cross-sectional view taken along the line E-E' in FIG. 7; and FIG. 8C is a partially enlarged diagram of a part F illustrated in FIG. 8B.

As illustrated in FIGS. 7 and 8B, a vibrator 300 includes a base 310, a lid 320 joined onto a main surface 310*a* of the base 310, a cavity 300*a* which is formed by the base 310 and a recess 320*a* formed at the lid 320, and an acceleration sensor element 330 as a functional element which is accommodated in the cavity 300*a* and is disposed on the main surface 310*a* of the base 310.

The acceleration sensor element 330 may include fixing sections 331*a* and 331*b* fixed onto the main surface 310*a* of the base 310, connection sections 332*a* and 332*b*, a movable section 333, a movable electrode 334, and fixed electrodes 335*a* and 335*b*.

The fixing sections 331*a* and 331*b* are joined onto the main surface 310*a* of the base 310 over a circumference of a recess 310*b* of the base 310. A diffusion object shielding portion 336 is formed at at least one of the fixing sections 331*a* and 331*b*, and is formed at the fixing section 331*a* in the present embodiment. As illustrated in FIG. 8B, the diffusion object shielding portion 336 is formed by a through hole 331*c* formed at the fixing section 331*a* of the acceleration sensor element 330 and the main surface 310*a* of the base 310. In the present example, the recess formed by the through hole 331*c* and the main surface 310*a* of the base 310 functions as the diffusion object shielding portion 336, but the diffusion object shielding portion 336 may be formed by forming a recess at the fixing section 331*a*.

Therefore, as illustrated in FIG. 8A, in a sealing hole 320*b* which is formed so as to penetrate through the lid 320, a region of a first opening 320*e* of the sealing hole 320*b* on a bottom 320*d* side of the recess 320*a* of the lid 320 is disposed in a region of the diffusion object shielding portion 336 in a plan view of the diffusion object shielding portion 336 and the vibrator 300, that is, when viewed from the Z axis direction.

FIG. 8C is an enlarged diagram of the part F around the sealing hole 320*b*. With reference to FIG. 8C, a description will be made of a relationship between the sealing hole 320*b* and the diffusion object shielding portion 336. An angle formed by a sealing hole surface 320*g* and the bottom 320*d* is set to α, and the sealing hole surface 320*g* connects the first opening 320*e* of the sealing hole 320*b* to a second opening 320*f* of the sealing hole 320*b* on the outside of the vibrator 300. A gap between the fixing section 331*a* of the acceleration sensor element 330 and the bottom 320*d* of the recess 320*a* of the lid 320 is set to h. If a distance between an edge of the first opening 320*e* of the sealing hole 320*b* and an opening edge of the diffusion object shielding portion 336 in a plan view is set to L, the vibrator 300 including the acceleration sensor element 330 also preferably has the relationship represented in Expression (1). The sealing hole 320*b* and the diffusion object shielding portion 336 are formed so as to satisfy the relationship represented in Expression (1). Therefore, metal components of the sealing member 40 which scatter when the sealing member 40 is melted by electron beams can be accommodated in the diffusion object shielding portion 336, and thus the scattering metal components can be prevented from being attached to the movable section 333 at which slight vibration is excited in the acceleration sensor element 330 described later as well. Consequently, it is possible to provide the vibrator 300 which includes the acceleration sensor element 330 having performance of high accuracy.

The movable section 333 is connected to the fixing sections 331a and 331b via the connection sections 332a and 332b. The connection sections 332a and 332b have desired spring constants, and are connected to the fixing sections 331a and 331b so that the movable section 333 can move in the X axis direction. In the example illustrated in FIG. 7, the connection sections 332a and 332b have a configuration in which a plurality of beams formed in the X axis direction and a plurality of beams formed in the Y axis direction are connected to each other so as to meander in the X axis direction. The movable section 333 is connected to a plurality of movable electrodes 334. The movable electrodes 334 extend in the +Y direction and −Y direction from the movable section 333, and are disposed in the X axis direction so as to form a so-called comb shape.

A plurality of fixed electrodes 335a and 335b are provided so that one end is joined onto the main surface 310a of the base 310 as a fixed end, and the other end extends toward the movable section 333 side as a free end. The fixed electrodes 335a and 335b are separated from the movable electrode 334 with a gap therebetween, and the fixed electrodes 335a and 335b are disposed so as to oppose each other with respect to the movable electrode 334 so that the fixed electrode 335a is disposed on one side of the movable electrode 334 in the +X direction and the fixed electrode 335b is disposed on the other side thereof in the −X direction.

As described above, the fixing sections 331a and 331b, the connection sections 332a and 332b, the movable section 333, and the movable electrode 334 are integrally formed. The acceleration sensor element 330 including the fixing sections 331a and 331b, the connection sections 332a and 332b, the movable section 333, the movable electrode 334, and the fixed electrodes 335a and 335b is formed from a silicon substrate (not illustrated) joined to the base 310 by using the MEMS technique as described above, and is doped with impurities such as phosphorous or boron so as to be conductive.

The movable section 333 is displaced in the X axis direction (the +X direction or the −X direction) while elastically deforming the connection sections 332a and 332b according to a variation in acceleration in the illustrated X axis direction. Due to such displacement, a gap between the movable electrode 334 and the fixed electrode 335a, and a gap between the movable electrode 334 and the fixed electrode 335b vary in sizes. According to the variations in the sizes of the gaps, capacitance between the movable electrode 334 and the fixed electrode 335a, and capacitance between the movable electrode 334 and the fixed electrode 335b vary in magnitude. In the vibrator 300 including the acceleration sensor element 330, acceleration in the X axis direction can be measured by detecting a variation in capacitance in the acceleration sensor element 330.

In the acceleration sensor element 330, slight displacement occurring at the movable section 333 is detected as a variation in capacitance due to slight variations in the gaps between the movable electrode 334 and the fixed electrodes 335a and 335b. Therefore, if metal components of the sealing member 40 which scatter in the cavity 300a from the sealing member 40 closing the sealing hole 320b are even slightly attached to the movable section 333, a weight variation occurs in the movable section 333, and thus it is difficult to accurately detect acceleration. Thus, as described above, a relationship between the sealing hole 320b and the diffusion object shielding portion 336 is made to satisfy the relationship represented in Expression (1). As a result, it is possible to minimize splash diffusion of the metal components of the sealing member 40 outward the diffusion object shielding portion 336 and thus to prevent metal splash from being attached to at least the movable section 333 of the acceleration sensor element 330.

Third Embodiment

The diffusion object shielding portion 24e or the diffusion object shielding portion 126, which accommodate metal components scattering from the sealing member 40 in the gyro sensor element 20 or the gyro sensor element 120 as functional elements provided in the vibrator 100 according to the first embodiment or the vibrator 200 according to the second embodiment described above, is integrally formed with the gyro sensor element 20 or the gyro sensor element 120, but, in the third embodiment, a description will be made of a vibrator including a gyro sensor element in which a functional element is formed separately from a diffusion object shielding portion.

Figure 9:
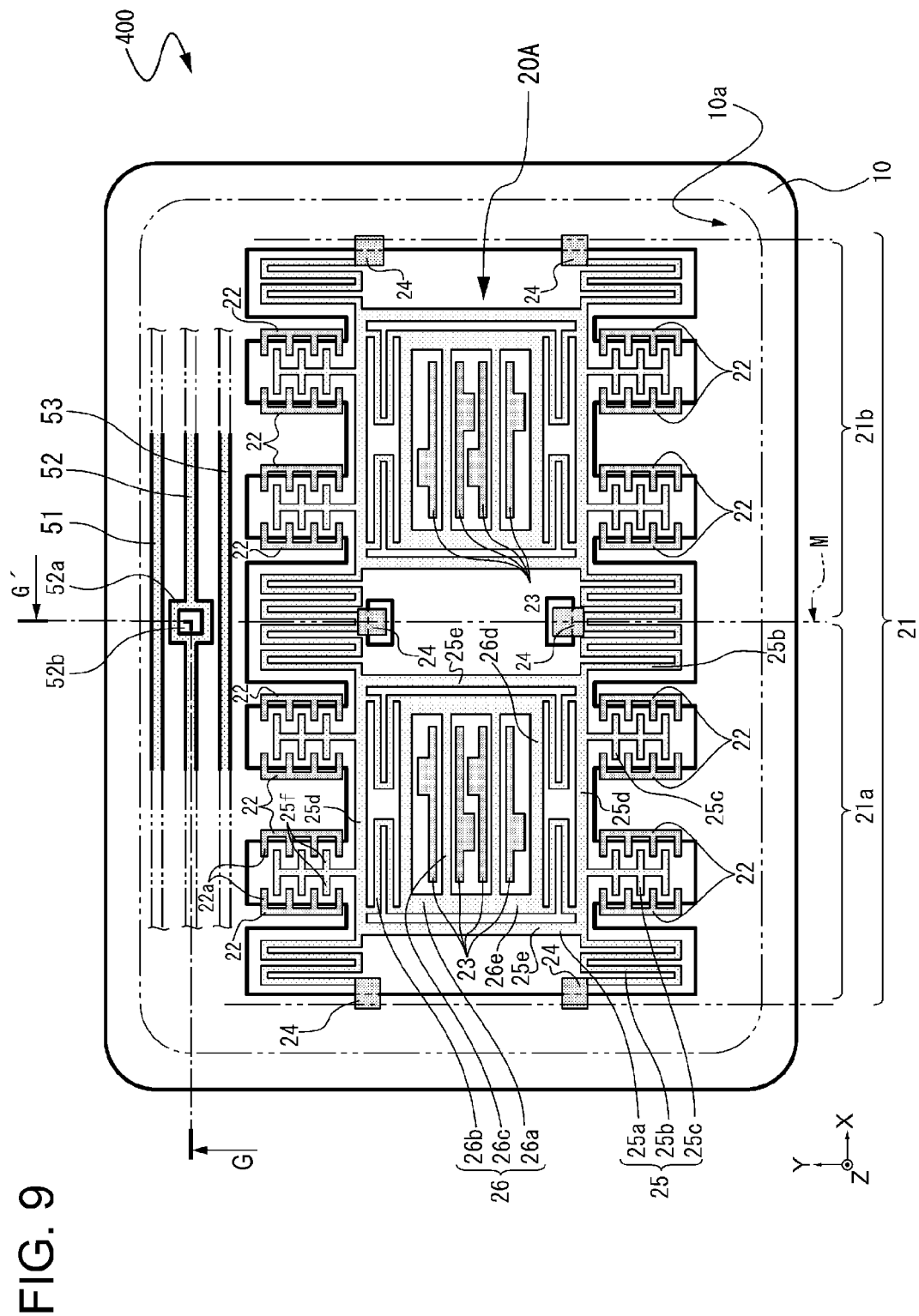
FIG. 9 is a plan view illustrating a vibrator according to a third embodiment.

FIG. 9 illustrates a vibrator 400 according to the third embodiment, and is a plan view in which a lid is not illustrated. The vibrator 400 according to the third embodiment is different from the vibrator 100 according to the first embodiment in terms of an arrangement of a diffusion object shielding portion and an arrangement of a sealing hole, and other constituent elements are the same. Therefore, the same constituent elements as those of the vibrator 100 according to the first embodiment are given the same reference numerals, and description thereof will be omitted. In FIG. 9, some of the wires connected to the gyro sensor element are not illustrated.

As illustrated in FIG. 9, the vibrator 400 according to the third embodiment includes a gyro sensor element 20A. The gyro sensor element 20A does not include the fixing section 24a having the diffusion object shielding portion 24e in the gyro sensor element 20 of the vibrator 100 according to the first embodiment, and includes six fixing sections 24 in an example illustrated in FIG. 9.

Wires which connect the gyro sensor element 20A to external connection terminals (not illustrated) of the vibrator 400 are disposed on the main surface 10a of the base 10. The wires include, for example, wires connected to the driving system structure 21, wires connected to the driving fixed electrodes 22, and wires connected to the detection fixed electrodes 23. As illustrated in FIG. 9, in the present example, a plurality of wires including wires 51, 52 and 53 are disposed on the main surface 10a of the base 10 substantially along an outer circumference of the gyro sensor element 20A. Among the wires 51, 52 and 53, a frame-shaped wire portion 52a is formed of at least one wire 52, and a diffusion object shielding portion 52b is formed inside the frame-shaped wire portion 52a.

Figure 10A:
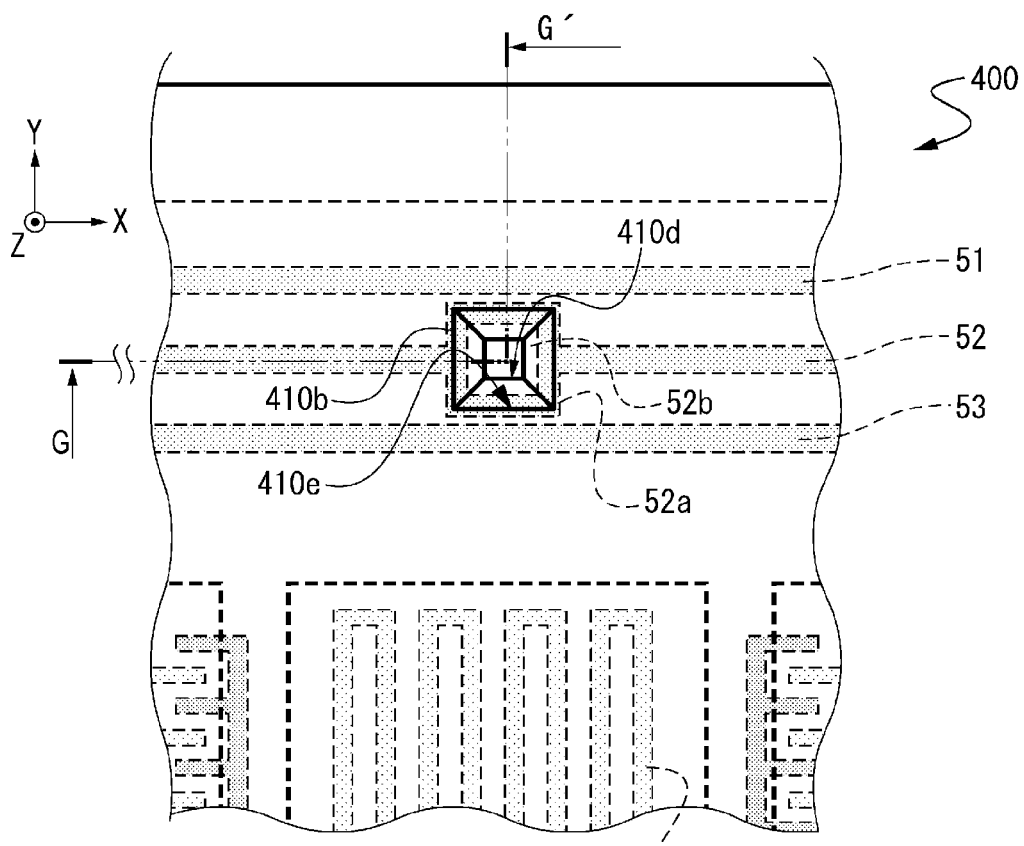
FIG. 10A is an enlarged plan view of the vicinity of a diffusion object shielding portion illustrated in FIG. 9.
Figure 10B:
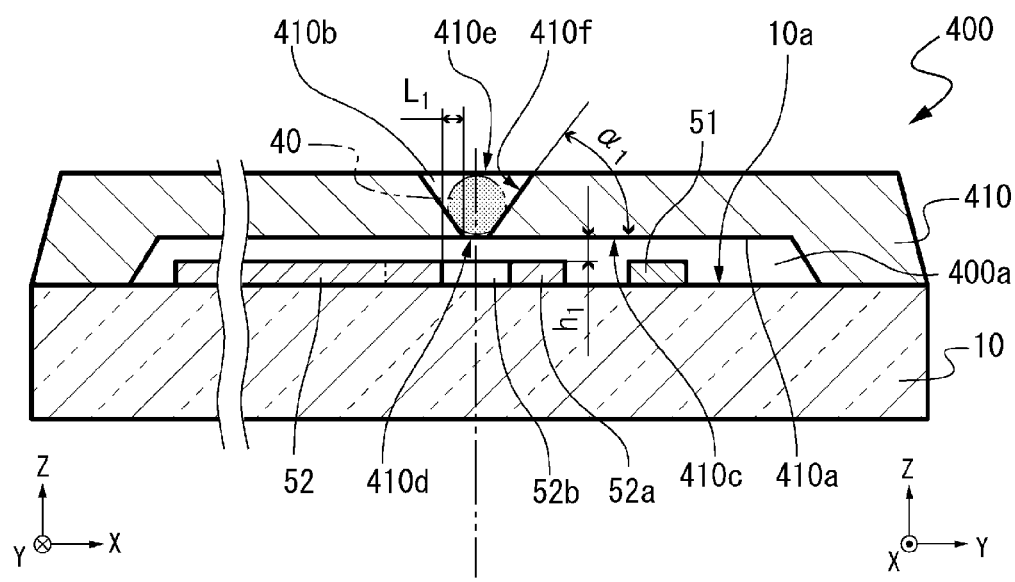
FIG. 10B is a cross-sectional view taken along the line G-G' in FIGS. 9 and 10A.

FIG. 10A is a partial exterior plan view of the vicinity of the diffusion object shielding portion 52b illustrated in FIG. 9, and FIG. 10B is a partial cross-sectional view taken along the line G-G' in FIGS. 9 and 10A. As illustrated in FIGS. 10A and 10B, a sealing hole 410b for air-tightly sealing a cavity 400a in which the gyro sensor element 20A is stored is formed in a lid 410. The sealing hole 410b has a first opening 410d which is opened toward the cavity 400a side and a second opening 410e which is opened outward the vibrator 400. The sealing hole 410b is formed so that the first opening 410d is disposed in a formation region of the diffusion object shielding portion 52b in a plan view of the vibrator 400, that is, when viewed from the Z axis direction.

As illustrated in FIG. 10B, a recess formed by an internal space of the frame-shaped wire portion 52a and the main surface 10a of the base 10 functions as the diffusion object shielding portion 52b. The diffusion object shielding portion 52b provided in the vibrator 400 according to the present embodiment also preferably satisfies the relationship represented in Expression (1) in the diffusion object shielding portion 24e provided in the vibrator 100 according to the first embodiment. In other words, preferably, a relationship between the sealing hole 410b, the first opening 410d, and the diffusion object shielding portion 52b illustrated in FIG. 10B employs the relationship represented in Expression (1).

In the frame-shaped wire portion 52a, the diffusion object shielding portion 52b, and the sealing hole 410b, a surface angle formed by a sealing hole surface 410f which connects the first opening 410d and the second opening 410e of the sealing hole 410b to each other, and a bottom 410c of a lid recess 410a, is set to α1, and a distance between an edge of the first opening 410d of the sealing hole 410b and an opening edge of the diffusion object shielding portion 52b when viewed from the Z axis direction is set to L1. If a gap between the frame-shaped wire portion 52a of the wire 52 and the bottom 410c of the lid recess 410a is set to h1, the following expression is preferably satisfied.

$$L1 > h1/\tan \alpha1 \tag{7}$$

Although described later, the wires 51, 52 and 53 may be formed from a silicon substrate for forming the gyro sensor element 20A as a functional element, and may be formed through the same manufacturing steps as in the formation of the gyro sensor element 20A. In other words, the gap h1 between the frame-shaped wire portion 52a of the wire 52 and the bottom 410c of the lid recess 410a is substantially the same as the gap h (refer to Expression (1)) between the gyro sensor element 20A and the bottom 410c of the lid recess 410a.

If the sealing hole 410b and the diffusion object shielding portion 52b are formed so as to satisfy the relationship represented in Expression (7), metal components of the sealing member 40 which scatter when the sealing member 40 is melted by electron beams can be accommodated in the diffusion object shielding portion 52b, and thus it is possible to prevent the scattering metal components from being attached to the driving system structure 21 at which slight vibration is excited in the gyro sensor element 20A. Therefore, it is possible to provide the vibrator 400 which includes the gyro sensor element 20A having performance of high accuracy.

In the vibrator 400 according to the third embodiment, the diffusion object shielding portion 52b is formed so as to be included in the wire 52 separately from the fixing section 24 provided at the driving system structure 21, but is not limited thereto, and may be formed on the main surface 10a of the base 10 separately from the gyro sensor element 20A as a functional element and the exemplified wires 51, 52 and 53. In other words, a diffusion object shielding portion provided in a vibrator 500 illustrated in FIGS. 11A and 11B may be used.

Figure 11A:
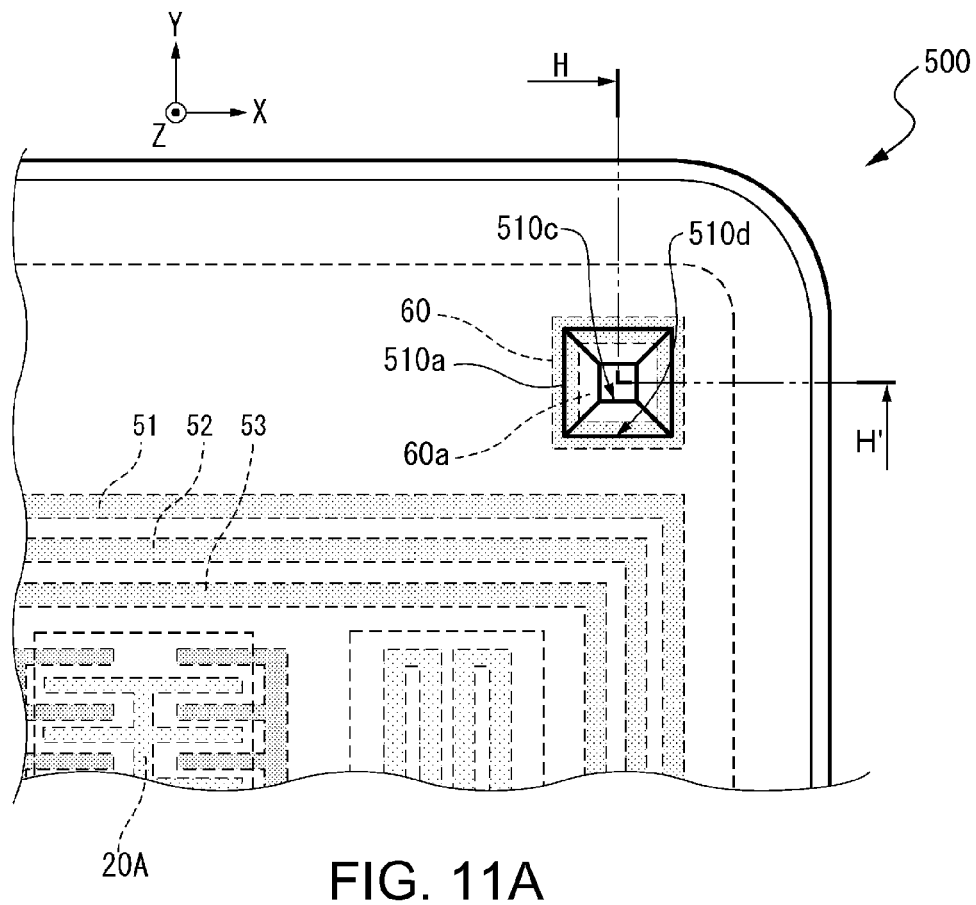
FIG. 11A is a partial plan view illustrating another form of the vibrator according to the third embodiment.
Figure 11B:
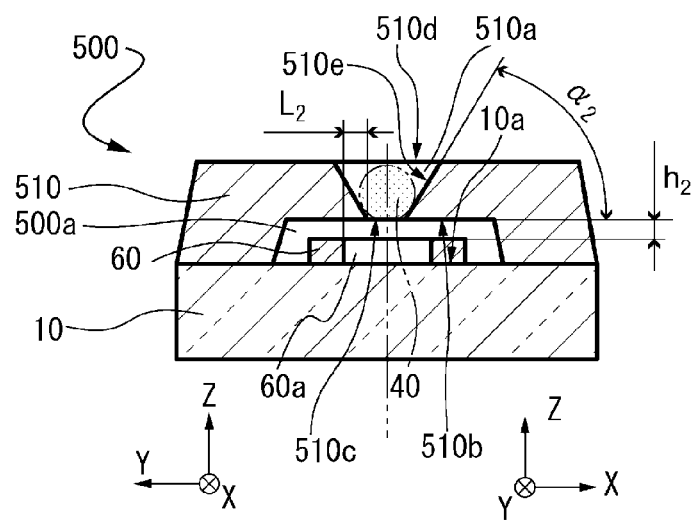
FIG. 11B is a cross-sectional view taken along the line H-H' in FIG. 11A.

FIG. 11A is a partial exterior plan view of the vibrator 500, and FIG. 11B is a cross-sectional view taken along the line H-H' in FIG. 11A. The same constituent elements as those of the vibrator 400 according to the third embodiment are given the same reference numerals, and description thereof will be omitted.

As illustrated in FIGS. 11A and 11B, the vibrator 500 includes a frame-shaped protrusion 60 on the main surface 10a of the base 10 on which the gyro sensor element 20A as a functional element is disposed. The protrusion 60 is disposed separately from the structures such as the gyro sensor element 20A and the wires 51, 52 and 53. A recess 60a is formed by an internal space of the protrusion 60 and the main surface 10a, and the recess 60a functions as a diffusion object shielding portion 60a (hereinafter, the recess 60a is referred to as a diffusion object shielding portion 60a) in the vibrator 500.

In a plan view of the vibrator 500, that is, when viewed from the Z axis direction, a surface angle formed by a sealing hole surface 510e which connects a first opening 510c of a sealing hole 510a on a recess bottom 510b side of a lid 510 to a second opening 510d outside the lid 510, and a recess bottom 510b of the lid 510, is set to α2, and a distance between an edge of the first opening 510c of the sealing hole 510a and an opening edge of the diffusion object shielding portion 60a when viewed from the Z axis direction is set to L2. If a gap between the protrusion 60 and the recess bottom 510b is set to h2, the following expression is preferably satisfied.

$$L2 > h2/\tan \alpha2 \tag{8}$$

If the sealing hole 510a and the diffusion object shielding portion 60a are formed so as to satisfy the relationship represented in Expression (8), metal components of the sealing member 40 which scatter in the cavity 500a when the sealing member 40 is melted by electron beams can be accommodated in the diffusion object shielding portion 60a, and thus it is possible to prevent the scattering metal components from being attached to the driving system structure 21 (refer to FIG. 9) at which slight vibration is excited in the gyro sensor element 20A. Therefore, it is possible to provide the vibrator 500 which includes the gyro sensor element 20A having performance of high accuracy.

Although described later, the protrusion 60 is formed from a silicon substrate for forming the gyro sensor element 20A as a functional element, and may be formed through the same manufacturing steps as in the formation of the gyro sensor element 20A. In other words, the gap h2 between the protrusion 60 and the recess bottom 510b of the lid 510 forming the cavity 500a is substantially the same as the gap h (refer to Expression (1)) between the gyro sensor element 20A and the recess bottom 510b.

Fourth Embodiment

Figure 12:
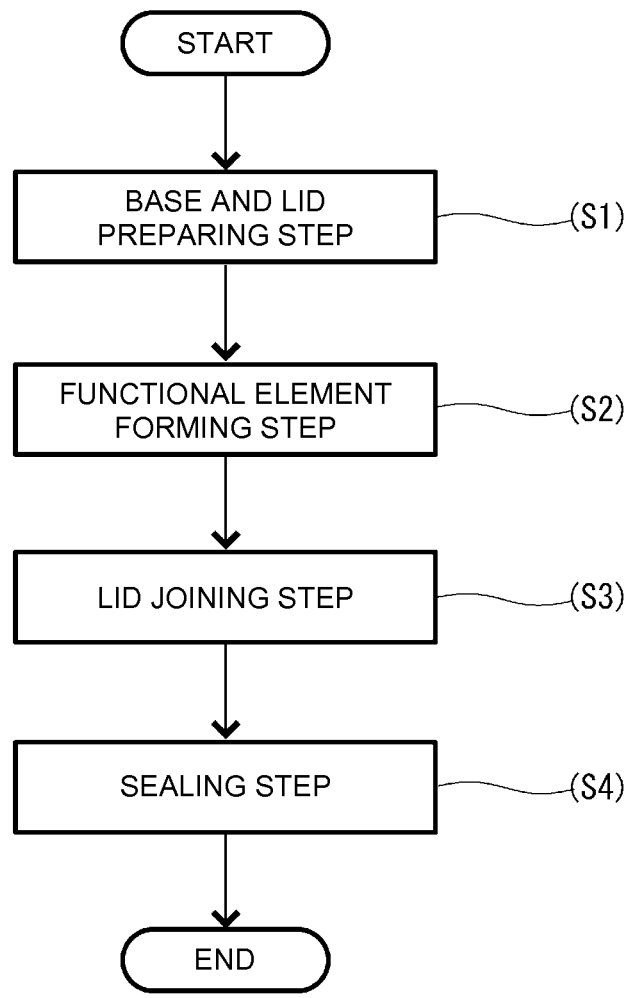
FIG. 12 is a flowchart illustrating a manufacturing of a vibrator according to a fourth embodiment.

A manufacturing of the above-described vibrators 100, 200, 300, 400 and 500 will be described by exemplifying the vibrator 100. FIG. 12 is a flowchart illustrating a manufacturing of the vibrator 100 according to the first embodiment as a fourth embodiment. In the manufacturing according to the present embodiment, in relation to the base 10 and the lid 30, the vibrator 100 is formed through steps described later as a wafer substrate in which a plurality of bases 10 are formed and collected and as a wafer substrate in which a plurality of lids 30 are formed and collected in the same manner as in the lid 30. However, for convenience of description, the base 10 and the lid 30 will be described as an individual piece.

Base and Lid Preparing Step

Figure 13A:
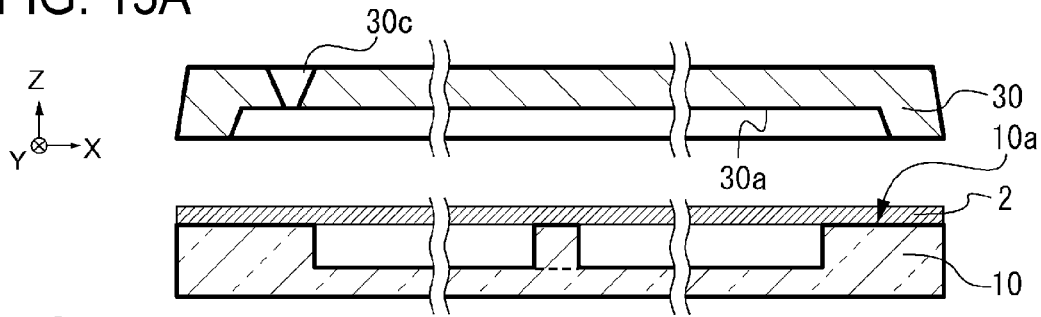
FIGS. 13A to 13E are cross-sectional views illustrating manufacturing steps of the vibrator according to the fourth embodiment.

In a base and lid preparing step (S1), the base 10 and the lid 30 illustrated in FIGS. 13A to 13E have a cross-sectional shape taken along the line A-A' in FIG. 1. As illustrated in FIG. 13A, the base 10 made of glass is prepared as a result of a silicon substrate 2 for forming the gyro sensor element 20 (refer to FIGS. 1 to 2D) as a functional element being joined onto the main surface 10a of the base 10. Wires electrically connecting the driving fixed electrodes 22 to each other, wires electrically connecting the detection fixed electrodes 23 to each other, and the like are formed on the base 10 in advance. Joining between the silicon substrate 2 and the base 10 is performed by using an anodic joining method, wafer direct joining, or methods equivalent thereto.

The lid 30 is provided in which the recess 30a forming the cavity 100a of the vibrator 100 and the sealing hole 30c which is a through hole are formed. The lid 30 prepared in the base and lid preparing step (S1) is provided with the sealing hole 30c. The sealing hole 30c is formed by wet etching the lid 30 formed from a silicon substrate, and the sealing hole surface 30f is formed as a tilt surface due to etching isotropy of the silicon substrate. Therefore, the first opening 30d can be made smaller than the second opening 30e. The sealing hole 30c may be formed not only in the wet etching method, but also in a dry etching method or a combination of the wet etching method and the dry etching method. In this case, at least an area of the first opening 30d is preferably smaller than an area of the second opening 30e.

Functional Element Forming Step

Figure 13B:
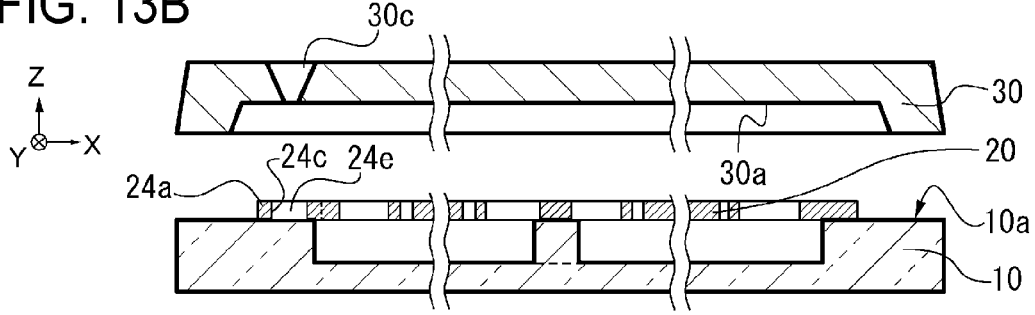

In a functional element forming step (S2), the silicon substrate 2 joined to the base 10 prepared in the base and lid preparing step (S1) is used to form the gyro sensor element 20 which is a functional element as illustrated in FIG. 13B. In the functional element forming step (S2), the silicon substrate 2 is finely processed into a form of the gyro sensor element 20 by using a micro electro mechanical systems (MEMS) technique employing a semiconductor manufacturing. At this time, the penetration portion 24c up to the main surface 10a is formed from the silicon substrate 2 in the fixing section 24a of the gyro sensor element 20 illustrated in FIG. 1. The recess 24e formed by the formed penetration portion 24c and the main surface 10a of the base 10 becomes the diffusion object shielding portion 24e.

As mentioned above, in the functional element forming step (S2), the gyro sensor element 20 is formed, and the penetration portion 24c forming the diffusion object shielding portion 24e is also formed in the silicon substrate 2 for forming the gyro sensor element 20 as a functional element. In the functional element forming step (S2), the processing method of simultaneously forming the diffusion object shielding portion 24e and the gyro sensor element 20 in the silicon substrate 2 processed into the gyro sensor element 20 can also be applied to a manufacturing method of the diffusion object shielding portion 126 in the vibrator 200, the diffusion object shielding portion 336 in the vibrator 300 including the acceleration sensor element 330, the diffusion object shielding portion 52b formed along with the wire 52 in the vibrator 400, or the diffusion object shielding portion 60a formed separately from the gyro sensor element 20A in the vibrator 500. Therefore, each of the diffusion object shielding portions 126, 336, 52b and 60a is formed from the silicon substrate 2 for forming a functional element.

Lid Joining Step

Figure 13C:
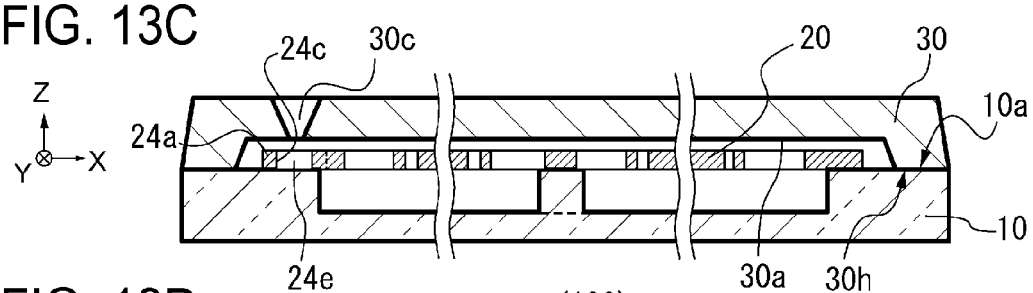

In a lid joining step (S3), the gyro sensor element 20 including the diffusion object shielding portion 24e is formed on the main surface 10a of the base 10 in the functional element forming step (S2), and then the lid 30 prepared in the base and lid preparing step (S1) is joined to the base 10. In the lid joining step (S3), as illustrated in FIG. 13C, the lid 30 is placed on the main surface 10a of the base 10 so that the sealing hole 30c provided in the lid 30 corresponds to the diffusion object shielding portion 24e in a plan view (refer to FIG. 3A), and the main surface 10a of the base 10 and a joining surface 30h of the lid 30 are joined to each other by using an anodic joining method.

Figure 13D:
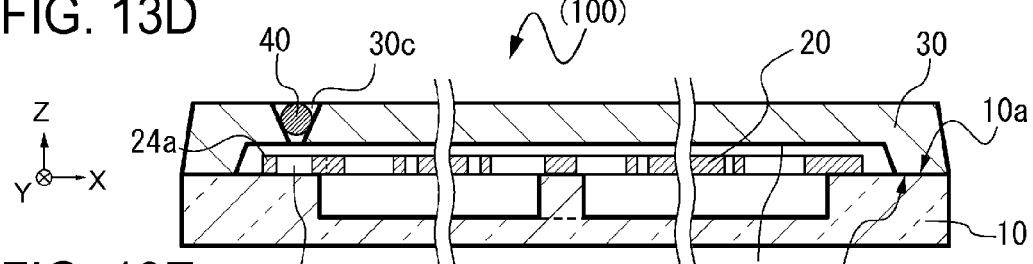

Sealing Step After the lid joining step (S3), a sealing step (S4) is performed. In the sealing step (S4), as illustrated in FIG. 13D, first, the sealing member 40 is placed in the sealing hole 30c. As the sealing member 40, for example, a solder ball of an Au—Ge alloy is preferably used. In a case where the solder ball of an Au—Ge alloy is used as the sealing member 40, wettability between the lid 30 and metal components of the sealing member 40 is increased through so-called metallization in which a metal film such as Cr or Au (not illustrated) is formed on the sealing hole 30c in advance, thereby allowing adhesion therebetween to be maintained. As the sealing member 40, an Au—Si alloy, an Au—Sn alloy, or the like may be used.

Figure 13E:
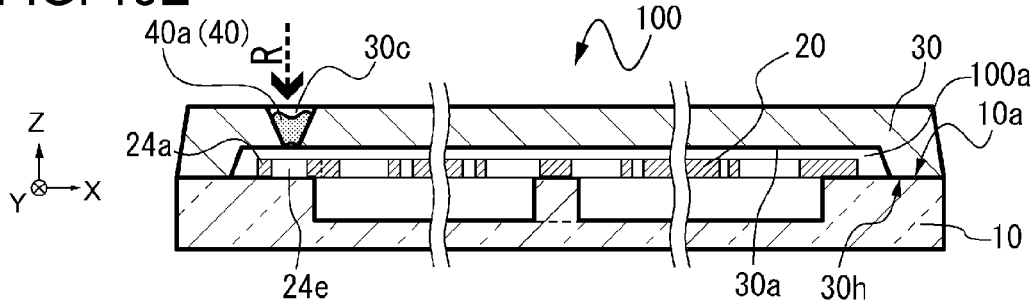

Next, in the sealing step (S4), the vibrator 100 illustrated in FIG. 13D in which the sealing member 40 is placed in the sealing hole 30c is stored in a chamber (not illustrated) which is in a decompressed environment or a vacuum environment, and the placed sealing member 40 is irradiated with electron beams R as illustrated in FIG. 13E so as to be melted, and thus a sealing portion 40a closing the sealing hole 30c is formed. Through the sealing step (S4), the cavity 100a of the vibrator 100 is air-tightly sealed in a decompressed state or a vacuum state, and thus the vibrator 100 is completed. If, as the electron beams R, for example, a short-wavelength laser such as a YAG laser or a carbon dioxide laser is used, the sealing member 40 can be melted in a short time, and thus it is possible to minimize thermal influence on the lid 30.

In the above-described manufacturing method, a form of an individual piece has been described, but, generally, the base 10 and the lid 30 are formed in a wafer state. Therefore, after the sealing step (S4), a step may be provided in which a vibrator wafer in which a plurality of vibrators 100 are formed is divided into individual pieces through dicing.

In the manufacturing method of the vibrator 100 according to the present embodiment, metal components of the sealing member 40 diffuse as splash in the cavity 100a although an amount thereof is small due to the sealing member 40 being irradiated with the electron beams R in the sealing step (S4) illustrated in FIG. 13E. The diffusing metal splash is accommodated in the diffusion object shielding portion 24e on the main surface 10a of the base 10 formed so as to correspond to the sealing hole 30c, and is thus prevented from being attached to the driving system structure 21 (refer to FIG. 1) of the gyro sensor element 20. Therefore, it is possible to provide the vibrator 100 which includes the gyro sensor element 20 having performance of high accuracy.

Fifth Embodiment

Figure 14A:
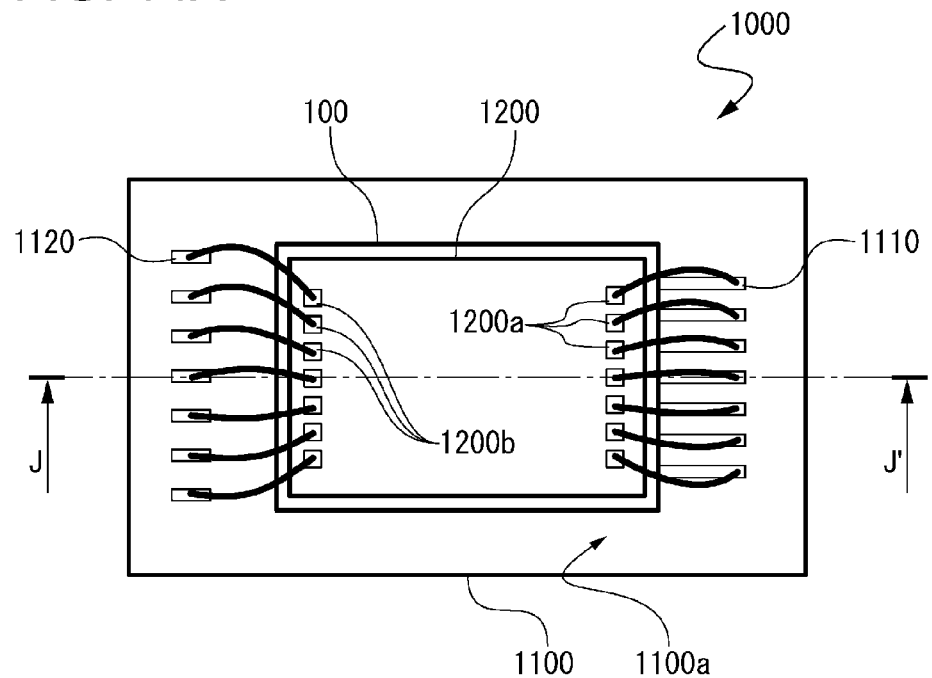
FIG. 14A is a plan view illustrating an electronic device according to a fifth embodiment.
Figure 14B:
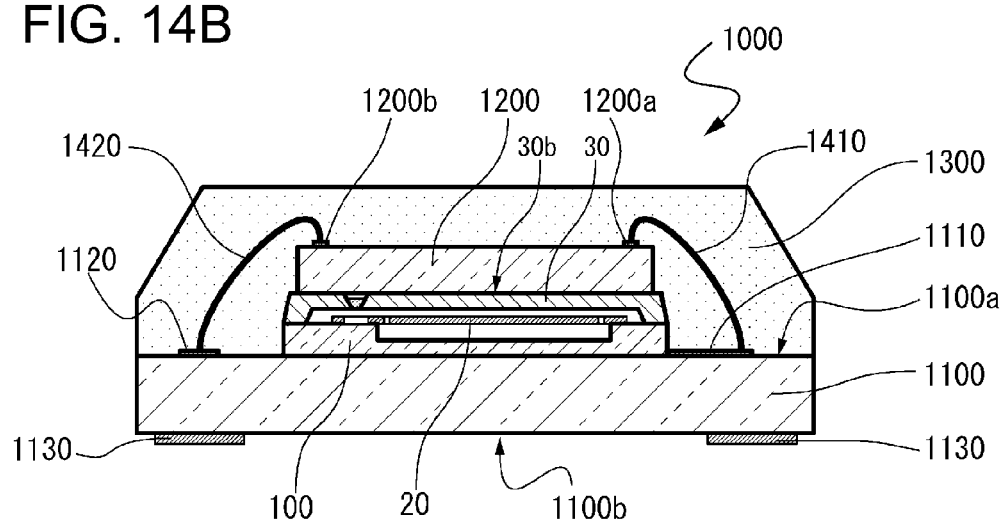
FIG. 14B is a cross-sectional view taken along the line J-J' in FIG. 14A.

FIGS. 14A and 14B illustrate an electronic device according to a fifth embodiment, in which FIG. 14A is a plan view in which a mold member is not illustrated, and FIG. 14B is a cross-sectional view taken along the line J-J' in FIG. 14A. An electronic device 1000 illustrated in FIGS. 14A and 14B includes the vibrator 100 according to the first embodiment, joined to a base substrate 1100. A semiconductor element 1200 is joined onto an outer surface 30b of the lid 30 of the vibrator 100. The semiconductor element 1200 includes at least a driving circuit which drives the gyro sensor element 20 (not illustrated) of the vibrator 100 and an acceleration calculation circuit which calculates acceleration from a detection signal which is output from the gyro sensor element 20. A mold member 1300 is formed so as to cover the vibrator 100 provided on the base substrate 1100 and the semiconductor element 1200.

The base substrate 1100 is preferably made of an electrically insulating plate-like material which is rectangular and has a planer shape, and may be, for example, a ceramic substrate or an epoxy resin substrate as illustrated in FIG. 14A. In the electronic device 1000 according to the present embodiment, the base substrate 1100 using a ceramic substrate will be described an example.

The vibrator 100 is joined onto a surface 1100a (hereinafter, referred to as a placing surface 1100a) of the base substrate 1100 on which the vibrator 100 is placed and joined, by using an epoxy-based resin adhesive or the like. A plurality of vibrator connection terminals 1110 and substrate connection terminals 1120 are formed on the placing surface 1100a, and external connection terminals 1130 for connection to electrodes provided on an external substrate (not illustrated) are formed on an outer surface 1100b opposite to the placing surface 1100a. The substrate connection terminals 1120 are electrically connected to the external connection terminals 1130 via wires (not illustrated) formed in the base substrate 1100. The vibrator connection terminals 1110 are electrically connected to external terminals (not illustrated) of the vibrator 100.

The semiconductor element 1200 is provided with a plurality of connection pads 1200a which are connected, via bonding wires 1410, to the vibrator connection terminals 1110 which are electrically connected to the vibrator 100. Further, the semiconductor element 1200 is provided with a plurality of connection pads 1200b which are connected to the substrate connection terminals 1120 formed on the placing surface 1100a of the base substrate 1100, via bonding wires 1420.

According to the above-described electronic device 1000, by using the vibrator 100 which prevents metal scattering objects from the sealing member 40 from being attached to the gyro sensor element 20, especially, the driving system structure 21 (refer to FIG. 1), and includes the gyro sensor element 20 having performance of high accuracy, it is possible to provide a physical quantity detection device with high accuracy and high reliability.

Sixth Embodiment

As electronic apparatuses according to a sixth embodiment, a description will be made of a smart phone and a digital still camera including the vibrators 100, 200, 300, 400 and 500 according to the first to third embodiments or the electronic device 1000 according to the fifth embodiment. In the present embodiment, the electronic device 1000 according to the fifth embodiment will be described as an example, but a smart phone or a digital still camera may be used which includes an electronic circuit board into which the vibrators 100, 200, 300, 400 and 500 according to the first to third embodiments are incorporated.

Figure 15:
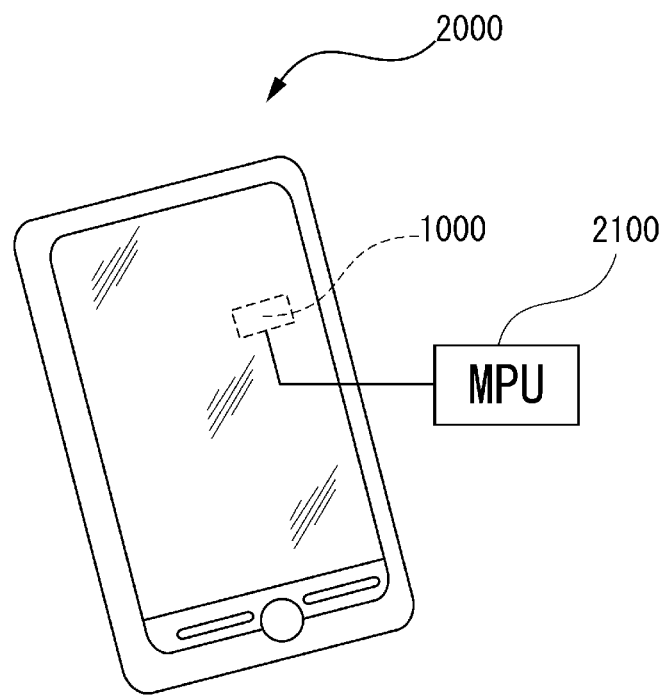
FIG. 15 is an exterior diagram illustrating a smart phone as an electronic apparatus according to a sixth embodiment.

FIG. 15 is an exterior view illustrating a smart phone 2000. The electronic device 1000 which detects an attitude of the smart phone 2000 is incorporated into the smart phone 2000. Since the electronic device 1000 is incorporated, so-called motion sensing is performed, and thus an attitude of the smart phone 2000 can be detected. A detection signal from the electronic device 1000 is supplied to, for example, a micro computer chip 2100 (hereinafter, referred to as an MPU 2100), and the MPU 2100 can perform various processes on the basis of motion sensing. The motion sensing can be used by incorporating the electronic device 1000 into electronic apparatuses such as a mobile phone, a portable gaming machine, a game controller, a car navigation system, a pointing system, a head mounted display, and a tablet PC.

Figure 16:
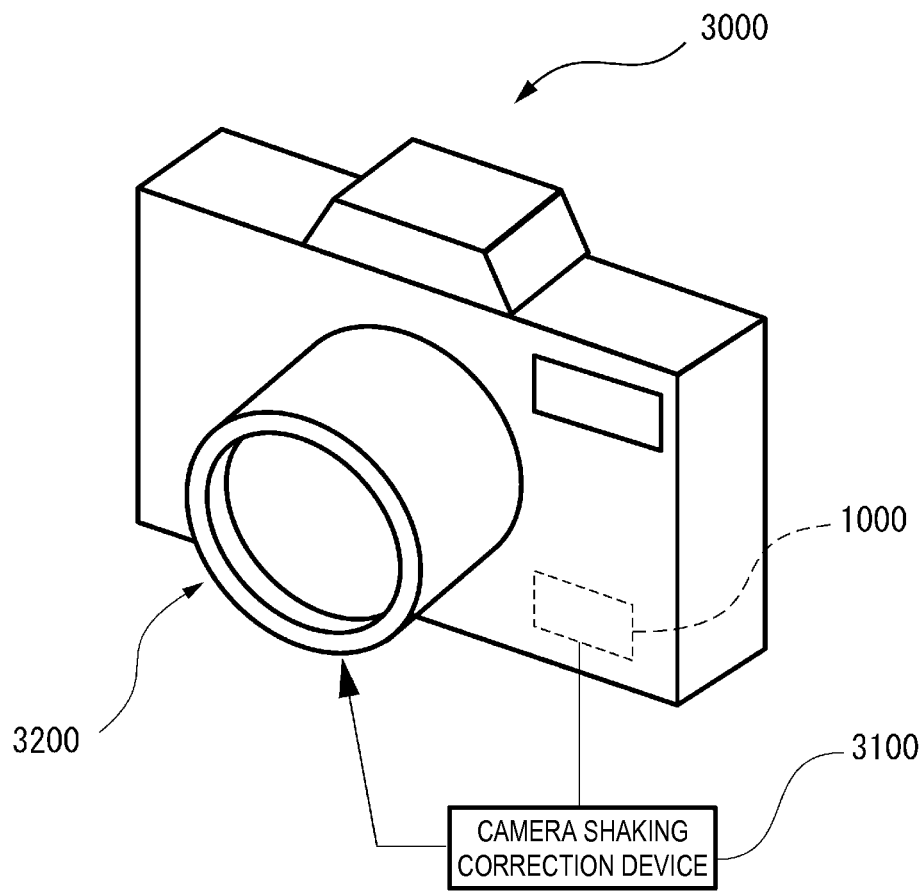
FIG. 16 is an exterior diagram illustrating a digital still camera as an electronic apparatus according to a sixth embodiment.

FIG. 16 is an exterior view illustrating a digital still camera 3000 (hereinafter, referred to as a camera 3000). The electronic device 1000 which detects an attitude of the camera 3000 is incorporated into the camera 3000. A detection signal from the incorporated electronic device 1000 is supplied to a camera shaking correction device 3100. The camera shaking correction device 3100 moves, for example, a specific lens in a lens set 3200 on the basis of the detection signal from the electronic device 1000, and thus can minimize image defects due to camera shaking. If the electronic device 1000 and the camera shaking correction device 3100 are incorporated into a digital video camera, camera shaking can be corrected in the same manner as in the camera 3000.

Seventh Embodiment

Figure 17:
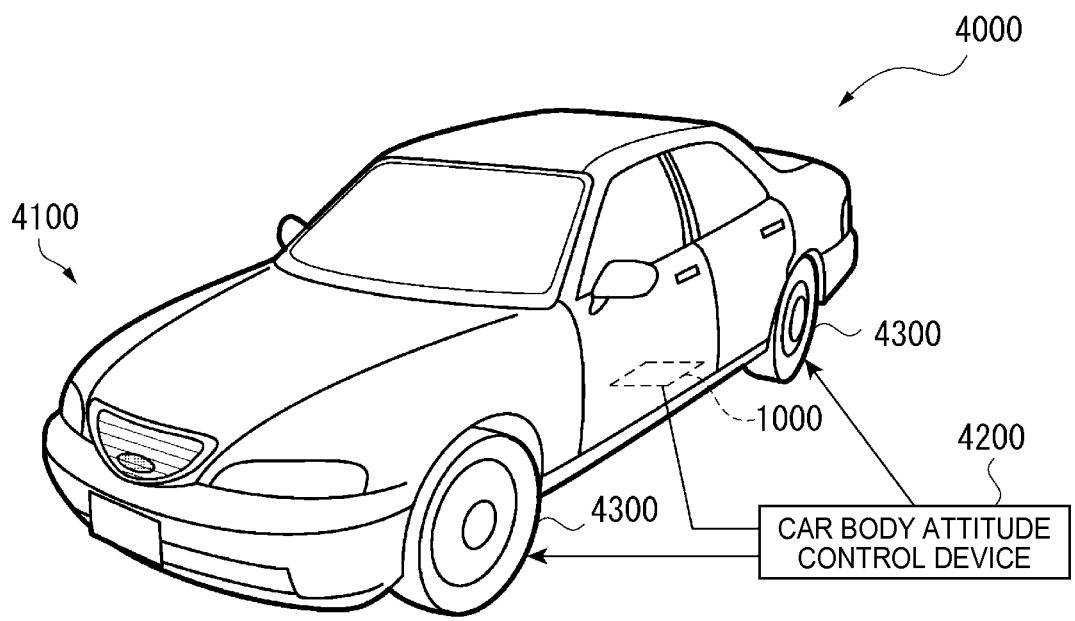
FIG. 17 is an exterior diagram illustrating an automobile as a moving object according to a seventh embodiment.

As a specific example of a moving object according to a seventh embodiment, including the vibrators 100, 200, 300, 400 and 500 according to the first to third embodiments or the electronic device 1000 according to the fifth embodiment, an automobile will be described. FIG. 17 is an exterior view of an automobile 4000 according to the seventh embodiment. As illustrated in FIG. 17, the electronic device 1000 is incorporated into the automobile 4000. The electronic device 1000 detects an attitude of a car body 4100. A detection signal from the electronic device 1000 is supplied to a car body attitude control device 4200. The car body attitude control device 4200 calculates an attitude state of the car body 4100 on the basis of the supplied signal, so as to control hardness and softness of a shock absorber (so-called suspension) according to, for example, an attitude of the car body 4100, or to control braking forces of individual wheels 4300. The attitude control using the electronic device 1000 may be used in bipedal walking robots, aircrafts, or toys such as a radio-controlled helicopter.

What is claimed is:
1. A vibrator comprising:
   a base having a peripheral area and a center area, the peripheral area being provided along an outer circumference of the base;
   a lid that has a top surface and a bottom surface opposite to each other, the lid being fixed to the base so as to form a cavity between the lid and the base;
   a sealing hole that is formed in the lid so that the sealing hole extends from the top surface to the bottom surface of the lid;
   a sealing member that is disposed in the sealing hole;
   a functional element that is located in the cavity, the functional element having:
      a driving member that is movable in the cavity;
      a driving fixed electrode;
      a detection fixed electrode; and
      first, second, and third wirings, one of the first, second and third wirings being connected to one of the driving member, the driving fixed electrode, and the detection fixed electrode, the first, second, and third wirings being formed on the peripheral area of the base and being formed in parallel to each other; and a diffusion object shielding member that is provided on the peripheral area to collect a diffusion object generated by the sealing member, the diffusion object shielding member having an accommodation opening facing the lid, wherein the sealing hole includes a first opening on the bottom surface of the lid, the first opening is located completely within the accommodation opening in a plan view, and the second wiring is sandwiched by the first and third wirings in the plan view, and the second wiring has two bifurcations to form a framed-shaped area corresponding to the accommodation opening in the plan view.

2. The vibrator according to claim 1, wherein the diffusion object shielding member is a penetration recess which is formed by a through hole formed in the second wiring of the functional element and a base main surface of the base on which the functional element is placed.

3. The vibrator according to claim 1, wherein the diffusion object shielding member is an element recess which is formed on a main surface of the second wiring of the functional element opposing the lid.

4. The vibrator according to claim 1, wherein, when a shortest distance between a circumference of the first opening of the sealing hole and a circumference of the accommodation opening of the diffusion object shielding member is set to L, a gap distance between the bottom surface of the lid and the diffusion object shielding member is set to h, and an angle formed by a sealing hole surface which connects a second opening of the sealing hole formed on the top surface of the lid to the first opening, and the bottom surface of the lid is set to $\alpha$, a condition of $L > h/\tan \alpha$ is satisfied.

5. An electronic device comprising the vibrator according to claim 1.

6. An electronic device comprising the vibrator according to claim 2.

7. An electronic device comprising the vibrator according to claim 3.

8. An electronic apparatus comprising the vibrator according to claim 1.

9. An electronic apparatus comprising the vibrator according to claim 2.

10. An electronic apparatus comprising the vibrator according to claim 3.

11. An electronic apparatus comprising the electronic device according to claim 5.

12. A moving object comprising the vibrator according to claim 1.

13. A moving object comprising the vibrator according to claim 2.

14. A moving object comprising the electronic device according to claim 5.

15. A moving object comprising the electronic apparatus according to claim 6.

16. A vibrator comprising:

a base having a peripheral area and a center area, the peripheral area being provided along an outer circumference of the base;

a lid that has a top surface and a bottom surface opposite to each other, the lid being fixed to the base so as to form a cavity between the lid and the base;

a sealing hole formed in the lid so that the sealing hole extends from the top surface to the bottom surface of the lid;

a sealing member disposed in the sealing hole;

a functional element located in the cavity, the functional element having:

a detection fixed electrode; and a wiring connected to the detection fixed electrode, wherein the wiring is formed on the peripheral area of the base; and a diffusion object shielding member provided on the peripheral area and configured to collect a diffusion object generated by the sealing member, the diffusion object shielding member having an accommodation opening facing the lid, wherein the sealing hole includes a first opening on the bottom surface of the lid, the first opening is located completely within the accommodation opening in a plan view, and the wiring has two bifurcations forming a framed-shaped area corresponding to the accommodation opening in the plan view.

17. The vibrator according to claim 16, wherein the diffusion object shielding member is a penetration recess formed by a through hole formed in the wiring of the functional element and a base main surface of the base on which the functional element is placed.

18. The vibrator according to claim 16, wherein the diffusion object shielding member is an element recess formed on a main surface of the wiring of the functional element opposing the lid.

19. The vibrator according to claim 16, wherein, when a shortest distance between a circumference of the first opening of the sealing hole and a circumference of the accommodation opening of the diffusion object shielding member is L, a gap distance between the bottom surface of the lid and the diffusion object shielding member is h, and an angle formed by a sealing hole surface which connects a second opening of the sealing hole formed on the top surface of the lid to the first opening, and the bottom surface of the lid is $\alpha$, $L > h/\tan \alpha$.

20. An electronic device comprising the vibrator according to claim 16.

* * * * *